US012614272B2

(12) United States Patent
Chiba et al.

(10) Patent No.: US 12,614,272 B2
(45) Date of Patent: Apr. 28, 2026

(54) INSPECTION APPARATUS, METHOD OF MANUFACTURING TEMPLATE, AND METHOD OF INSPECTING TEMPLATE

(71) Applicant: Kioxia Corporation, Tokyo (JP)

(72) Inventors: Keisuke Chiba, Kawasaki Kanagawa (JP); Ryoji Yoshikawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 464 days.

(21) Appl. No.: 18/180,999

(22) Filed: Mar. 9, 2023

(65) Prior Publication Data

US 2023/0410283 A1 Dec. 21, 2023

(30) Foreign Application Priority Data

Jun. 21, 2022 (JP) ................................. 2022-099730

(51) Int. Cl.
*G06T 7/00* (2017.01)
*G06F 30/10* (2020.01)
(Continued)

(52) U.S. Cl.
CPC ............ *G06T 7/0008* (2013.01); *G06F 30/10* (2020.01); *G06T 7/60* (2013.01); *G06V 10/25* (2022.01); *G06T 2207/30148* (2013.01)

(58) Field of Classification Search
CPC ..................... G06T 7/0008; G06T 7/60; G06T 2207/30148; G06F 30/10; G06V 10/25
See application file for complete search history.

(56) References Cited

U.S. PATENT DOCUMENTS 6,538,249 B1 3/2003 Takane et al.
6,580,502 B1 6/2003 Kuwabara
(Continued)

FOREIGN PATENT DOCUMENTS

CN 111738994 A 10/2020
CN 114097313 A 2/2022
(Continued)

*Primary Examiner* — Wednel Cadeau
(74) *Attorney, Agent, or Firm* — Holtz, Holtz & Volek PC

(57) ABSTRACT

An inspection apparatus according to an embodiment is an inspection apparatus that inspects a defect for a sample having a region including a plurality of patterns with different heights from a reference plane in a first direction intersecting the reference plane, including a focus decision unit that decides a plurality of target values regarding a relative position between the reference plane and the lens on a basis of height information regarding the height, an image acquisition unit that adjusts the relative position between the reference plane and the lens on a basis of the plurality of target values and causes the imaging unit to capture a plurality of images including a whole of the region from the first direction at the respective relative positions, an image synthesis unit that extracts a first part including a first pattern from a first image among the plurality of images, extracts a second part including a second pattern from a second image among the plurality of images, and generates a synthetic image including the first part and the second part, and a defect determination unit that determines presence or absence of the defect for the sample from the synthetic image.

13 Claims, 24 Drawing Sheets

(51) Int. Cl.
    *G06T 7/60*        (2017.01)
    *G06V 10/25*     (2022.01)

(56) References Cited

U.S. PATENT DOCUMENTS

| | | |
|---|---|---|
| 11,188,058 B2 | 11/2021 | Asada et al. |
| 11,443,419 B2 | 9/2022 | Yasui et al. |
| 2012/0081538 A1* | 4/2012 | Ogawa ................. G01N 21/956 |
| | | 348/87 |
| 2013/0033705 A1* | 2/2013 | Taniguchi .......... G01N 21/9501 |
| | | 356/237.5 |
| 2014/0002826 A1* | 1/2014 | Inoue ............... G01N 21/95607 |
| | | 356/601 |
| 2014/0111636 A1 | 4/2014 | Inoue et al. |
| 2017/0072622 A1 | 3/2017 | Morita |
| 2020/0294218 A1 | 9/2020 | Yasui et al. |
| 2021/0096461 A1 | 4/2021 | Kumada |
| 2021/0350507 A1 | 11/2021 | Fang et al. |
| 2022/0264019 A1 | 8/2022 | Kobayashi et al. |

FOREIGN PATENT DOCUMENTS

| | | |
|---|---|---|
| DE | 102019201916 A1 | 4/2019 |
| JP | 2001344599 A | 12/2001 |
| JP | 2006046944 A | 2/2006 |
| JP | 2017055058 A | 3/2017 |
| JP | 2017083174 A | 5/2017 |
| JP | 2017118057 A | 6/2017 |
| JP | 2017129385 A | 7/2017 |
| JP | 2020098922 A | 6/2020 |
| JP | 2020148615 A | 9/2020 |
| JP | 2021057361 A | 4/2021 |

* cited by examiner

CHj  CHk

CHi  CHj  CHk

FIG.19A
FIG.19B
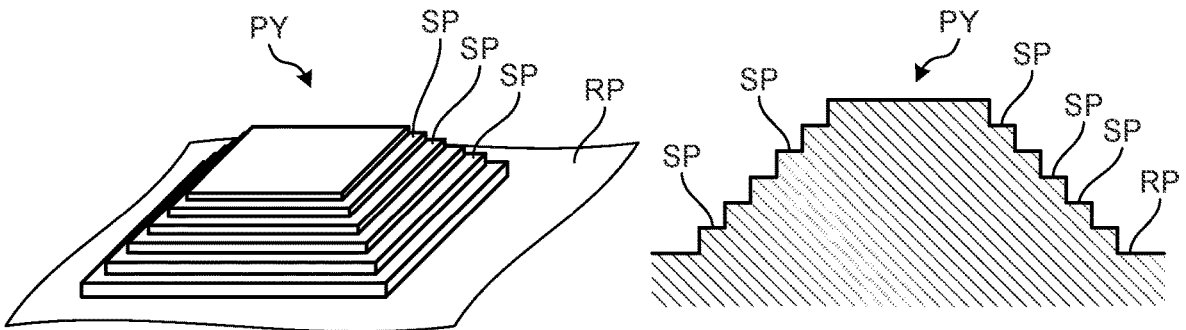
FIG.19C
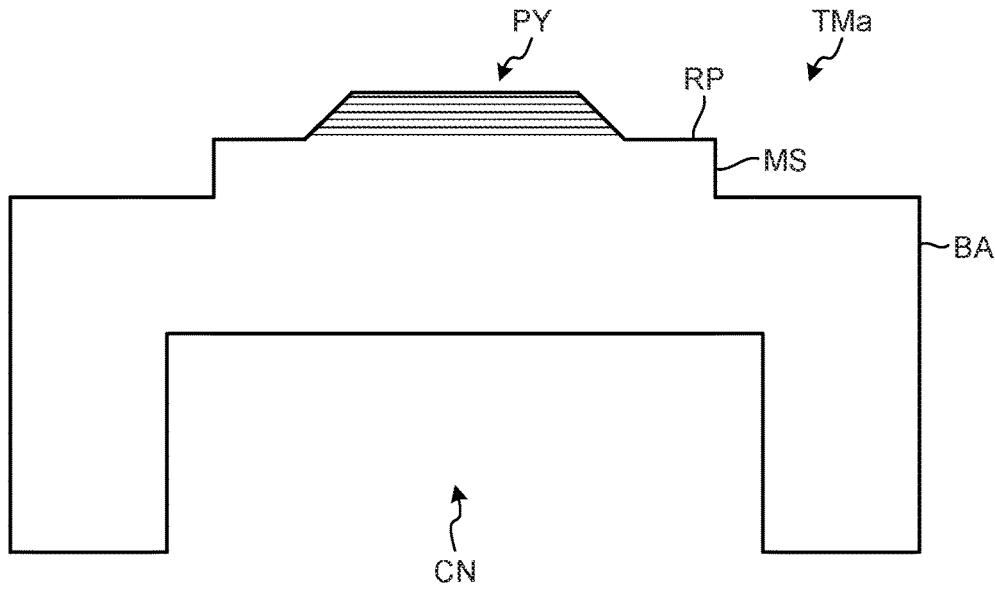

INSPECTION APPARATUS, METHOD OF MANUFACTURING TEMPLATE, AND METHOD OF INSPECTING TEMPLATE

CROSS-REFERENCE TO RELATED APPLICATIONS

This application is based upon and claims the benefit of priority from Japanese Patent Application No. 2022-099730, filed on Jun. 21, 2022; the entire contents of which are incorporated herein by reference.

FIELD

Embodiments described herein relate generally to an inspection apparatus, a method of manufacturing a template, and a method of inspecting the template.

BACKGROUND

The inspection for any defects at the semiconductor device manufacturing process is sometimes subject to a template having a plurality of patterns with different heights, a semiconductor device to which the template's pattern is transferred, or the like. Such defect inspection can sometimes employ a technique of capturing an image of a predetermined range of an object to be inspected from above and comparing a plurality of patterns included in the captured image.

These multiple patterns having different heights can make it difficult to focus on all the patterns in the image in some cases. This may cause the inspection accuracy to deteriorate for the pattern of an unfocused or out-of-focus image portion.

BRIEF DESCRIPTION OF THE DRAWINGS

FIGS. 19A to 19C are schematic diagrams illustrating an exemplary configuration of a template according to a modification of an embodiment;

DETAILED DESCRIPTION

An inspection apparatus according to an embodiment is an inspection apparatus that inspects a defect for a sample having a region including a plurality of patterns with different heights from a reference plane in a first direction intersecting the reference plane, including an imaging unit that captures an image of the region, a lens, a focus decision unit that decides a plurality of target values regarding a relative position between the reference plane and the lens on a basis of height information regarding the height, an image acquisition unit that adjusts the relative position between the reference plane and the lens on a basis of the plurality of target values and causes the imaging unit to capture a plurality of images including a whole of the region from the first direction at the respective relative positions, an image synthesis unit that extracts a first part including a first pattern from a first image among the plurality of images, extracts a second part including a second pattern from a second image among the plurality of images, and generates a synthetic image including the first part and the second part, the first pattern and the second pattern being included in the plurality of patterns, the second pattern being different in height from the first pattern, and a defect determination unit that determines presence or absence of the defect for the sample from the synthetic image, in which the first image is captured at the relative position adjusted on a basis of a first target value among the plurality of target values, the second image is captured at the relative position adjusted on a basis of a second target value among the plurality of target values, the first target value is decided on a basis of a first height information regarding the first pattern among the height information, and the second target value is decided on a basis of a second height information regarding the second pattern among the height information.

The present invention is now described in detail with reference to the accompanying drawings. Note that the present invention is not limited to an embodiment described below. Besides, the components in an embodiment described below include those that can be easily conceivable to those skilled in the art or substantially the same.

Embodiment

An embodiment is now described in detail with reference to the drawings.

(Exemplary Configuration of Inspection Apparatus)

Figure 1:
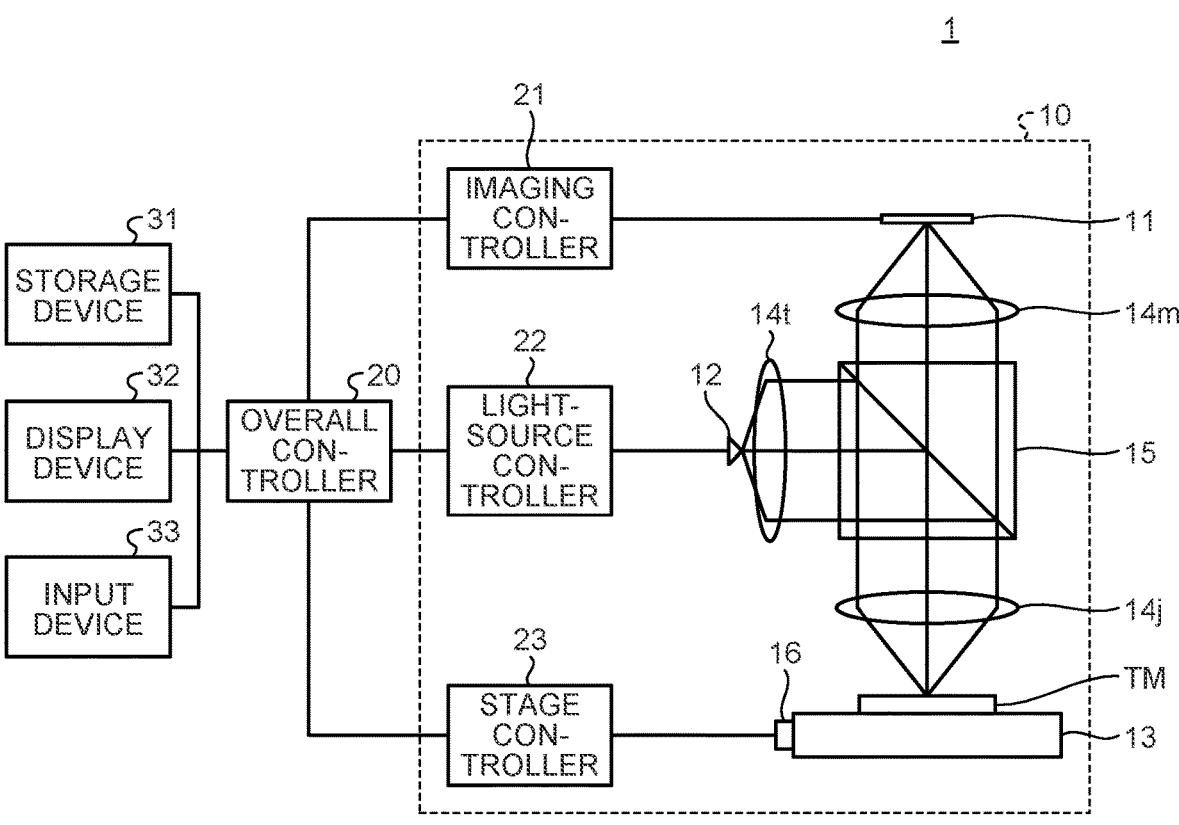
FIG. 1 is a schematic diagram illustrating an exemplary configuration of an inspection apparatus according to an embodiment.

FIG. 1 is a schematic diagram illustrating an exemplary configuration of an inspection apparatus 1 according to an embodiment.

The inspection apparatus 1 according to an embodiment is configured as an optical inspection apparatus that inspects any defect in a sample, such as a template TM with a plurality of patterns with different heights from a reference plane. Such an optical inspection apparatus irradiates a sample with light and detects defects, foreign matter, or the like of the sample from the reflected light.

The template TM is used, for example, for the imprint processing of manufacturing semiconductor devices. In the imprint processing, the pattern of the template TM is transferred to a resist film or the like on a processing-target film and used for processing the processing-target film.

As illustrated in FIG. 1, the inspection apparatus 1 includes an inspection mechanism 10, an overall controller 20, an imaging controller 21, a light-source controller 22, a stage controller 23, a storage device 31, a display device 32, and an input device 33.

The inspection mechanism 10 is a physical and mechanical component of the inspection apparatus 1. The inspection mechanism 10 includes an imaging unit 11, a light source 12, a stage 13, an illumination lens 14$t$, an image-forming lens 14$m$, an objective lens 14$j$, a beam splitter 15, and a driving mechanism 16.

The stage 13 is configured so that a template TM, which is a sample to be inspected, can be placed on the stage. The driving mechanism 16 drives the stage 13 in vertical and horizontal directions under the control of the stage controller 23. Such driving allows the relative position of the template TM placed on the stage 13 to the objective lens 14$j$ to be changed.

The light source 12 is an argon ion laser oscillator, a mercury lamp, or the like, and irradiates the template TM placed on the stage 13 with light such as deep ultraviolet (DUV). The light source 12 is connected to a high-voltage power supply circuit (not illustrated). A voltage applied from the high-voltage power supply circuit enables the light source 12 to generate and emit light of a desired wavelength.

The light from the light source 12 passes through the illumination lens 14$t$ and reaches the beam splitter 15. The beam splitter 15 has a reflecting surface inclined at approximately 45° (degrees) to the illumination lens 14$t$. The reflecting surface of the beam splitter 15 reflects light polarized in a predetermined direction and transmits light polarized in other directions.

Such a configuration allows the light emitted from the illumination lens 14$t$ to be reflected toward the template TM on the stage 13. In addition, the light reflected from the template TM and returned to the beam splitter 15 is directed toward the imaging unit 11 and passes through the imaging unit 11.

The objective lens 14$j$ is arranged above the stage 13 on the side of the template TM and focuses the light reflected by the beam splitter 15 onto an observation surface of the template TM. The image-forming lens 14$m$ forms an image on the imaging unit 11 of the light, which is reflected from the template TM and transmitted through the beam splitter 15.

The imaging unit 11 is a camera using, for example, a charge-coupled device (CCD) or complementary-metal-oxide semiconductor (CMOS) image sensor. The imaging unit 11 captures an image formed through the objective lens 14$j$ from the light from the template TM. The image captured by the imaging unit 11 is sent to the overall controller 20 and stored in the storage device 31.

The overall controller 20 is connected to the imaging controller 21, the light-source controller 22, and the stage controller 23. The overall controller 20 generates and sends various control signals and sends the signals to these controllers. Such a configuration allows the overall controller 20 to control the inspection mechanism 10 through the imaging controller 21, the light-source controller 22, and the stage controller 23, and also manages and controls the inspection apparatus 1 as a whole.

The imaging controller 21 generates a control signal used to operate the imaging unit 11 on the basis of a command from the overall controller 20, causing the imaging unit 11 to capture an image including a predetermined range of the observation surface of the template TM. The light-source controller 22 generates a control signal used to apply a voltage from a high-voltage power supply circuit (not illustrated) to the light source 12 on the basis of the command from the overall controller 20, causing the light source 12 to emit light. The stage controller 23 generates a control signal to drive the driving mechanism 16 on the basis of the command from the overall controller 20, causing the driving mechanism 16 to drive the stage 13.

The storage device 31 is, for example, a hard disk drive (HDD), solid-state drive (SSD), or the like. The storage device 31 functions as an auxiliary storage device for the overall controller 20. The storage device 31 stores, for example, an image captured by the imaging unit 11, information regarding a pattern of the template TM as an inspection-target object, various inspection conditions, a threshold used to determine a defect, and the like.

The display device 32 is a monitor such as a liquid crystal display (LCD), organic electro-luminescence (EL) display, or the like. The display device 32 displays, for example, an image captured by the imaging unit 11, information regarding a pattern of the template TM, various inspection conditions, a threshold used to determine a defect, and the like.

The input device 33 is a keyboard, mouse, and other interfaces enabling a user of the inspection apparatus 1 to input the user's instruction to the overall controller 20. The input device 33 allows a user to input an instruction for the inspection apparatus 1, various inspection conditions, a threshold used to determine a defect, and the like.

(Exemplary Configuration of Overall Controller)

Figure 2:
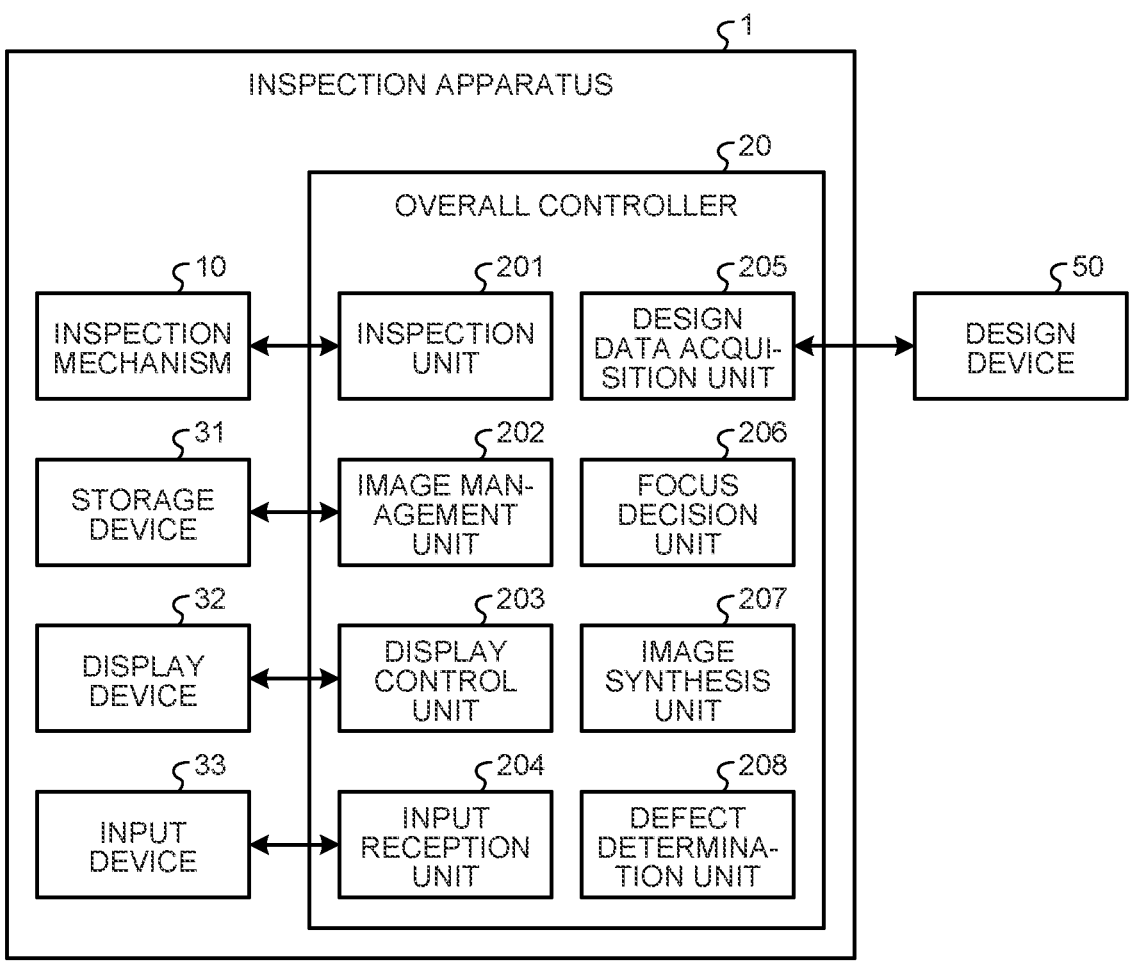
FIG. 2 is a block diagram illustrating an exemplary functional configuration of an overall controller according to an embodiment together with other components of the inspection apparatus.

An exemplary configuration of the overall controller provided in the inspection apparatus 1 according to an embodiment is now described with reference to FIG. 2. FIG. 2 is a block diagram illustrating an exemplary functional configuration of an overall controller 20 according to an embodiment together with other components of the inspection apparatus 1.

The overall controller 20 according to an embodiment is configured as a computer provided with, for example, a central processing unit (CPU), read-only memory (ROM), and random-access memory (RAM). The CPU of the overall controller 20 loads and executes a control program stored in the ROM or the like onto the RAM, being implemented as functional units described below.

As illustrated in FIG. 2, the overall controller includes, as functional units, an inspection unit 201, an image management unit 202, a display control unit 203, an input reception unit 204, a design data acquisition unit 205, a focus decision unit 206, an image synthesis unit 207, and a defect determination unit 208.

The inspection unit 201 sends various control signals to, for example, the imaging controller 21, the light-source controller 22, and the stage controller 23 described above. The inspection unit 201 controls the inspection mechanism 10 through these controllers and causes the inspection mechanism 10 to generate an image necessary for the defect inspection of the template TM.

In this case, the inspection unit 201 controls the respective units of the inspection mechanism 10 on the basis of, for example, various inspection conditions input by a user and design data acquired from a design device 50 through the design data acquisition unit 205. The design data includes information regarding a pattern of the template TM, which is an inspection-target object, as will be described later. In one example, the template TM has a plurality of patterns with different heights from a reference plane, as described above. Thus, the inspection unit 201 causes the imaging unit 11 to capture a plurality of images while sequentially changing the relative position between the template TM and the objective lens 14$j$ on the basis of, for example, the design data.

The inspection unit 201 acquires the plurality of images captured as described above from the imaging unit 11. Thus, the inspection unit 201 functions as, for example, an image acquisition unit that acquires the plurality of images from the imaging unit 11.

The image management unit 202 manages, for example, the plurality of images captured by the imaging unit 11, a corrected image obtained by correcting these images by an image synthesis unit 207 described later, and a synthetic image obtained by synthesizing these corrected images by the image synthesis unit 207. Specifically, the image management unit 202 stores the plurality of images, the corrected image, the synthetic image, and the like in the storage device 31. In addition, the image management unit 202 reads out the plurality of images, the corrected image, the synthetic image, and the like from the storage device 31.

The display control unit 203 controls various indications to be displayed on the display device 32. Specifically, the display control unit 203 causes the display device 32 to display the plurality of images, the corrected image, the synthetic image, and the like in accordance with, for example, an instruction from a user. In addition, the display control unit 203 causes the display device 32 to display the pattern information of the template TM acquired from the design device 50 and various inspection conditions, a threshold used to determine a defect, and the like that are input from the input device 33.

The input reception unit 204 receives an instruction for the inspection apparatus 1, various inspection conditions, a threshold used to determine a defect, and the like that are input through the input device 33.

The design data acquisition unit 205 acquires design data for the template TM from the design device 50. The design device 50 is a computer-aided design (CAD) device or similar device that enables designing the template TM. The design device 50 holds the acquired design data for the template TM. The design data for the template TM includes, for example, pattern information regarding the height of the pattern formed on the template TM from the reference plane, the arrangement of the patterns on the reference plane, and the like.

The focus decision unit 206 decides a plurality of target values regarding the relative position between the template TM and the objective lens 14$j$ on the basis of the pattern height information included in the design data. In capturing an image of the template TM by the imaging unit 11, the relative position between the template TM and the objective lens 14$j$ is appropriately adjusted on the basis of the plurality of target values. The plurality of images focused by the imaging unit 11 is captured at each of the adjusted positions.

The image synthesis unit 207 synthesizes a plurality of images to generate a synthetic image. In generating the synthetic image, the image synthesis unit 207 first corrects, for example, the luminance, magnification, and deviation in the image-capturing position of the image captured by the imaging unit 11 in vertical, horizontal, and rotational directions. The image synthesis unit 207 then synthesizes a plurality of corrected images to generate a synthetic image. The functions of the image synthesis unit 207 will be described later in detail.

The defect determination unit 208 determines whether a defect is included or not in the synthetic image on the basis of a threshold or the like used to determine a defect, which is input by a user.

Moreover, the functional configuration of the overall controller 20 illustrated in FIG. 2 is merely illustrative. The overall controller 20 can have a functional configuration different from the above disclosure.

In one example, although the design data for the template TM is acquired by the overall controller 20 from the design device 50, the design data or the pattern information of the template TM can also be input by a user through the input device 33. In addition, at least one of the storage device 31, the display device 32, and the input device 33 can be incorporated in the overall controller 20 configured as a computer.

Further, the functions of the overall controller 20 can be implemented by a general-purpose computer executing the control program as described above. Besides, the entirety or a part of the functions of the overall controller 20 can be implemented using an application-specific integrated circuit (ASIC).

(Exemplary Function of Inspection Apparatus)

An exemplary function of the inspection apparatus 1 according to an embodiment is now described in detail with reference to FIGS. 3A to 9. The detailed description is now given of an exemplary configuration of the template TM to be inspected in the inspection apparatus 1.

Figures 3A, 3B, 3C:
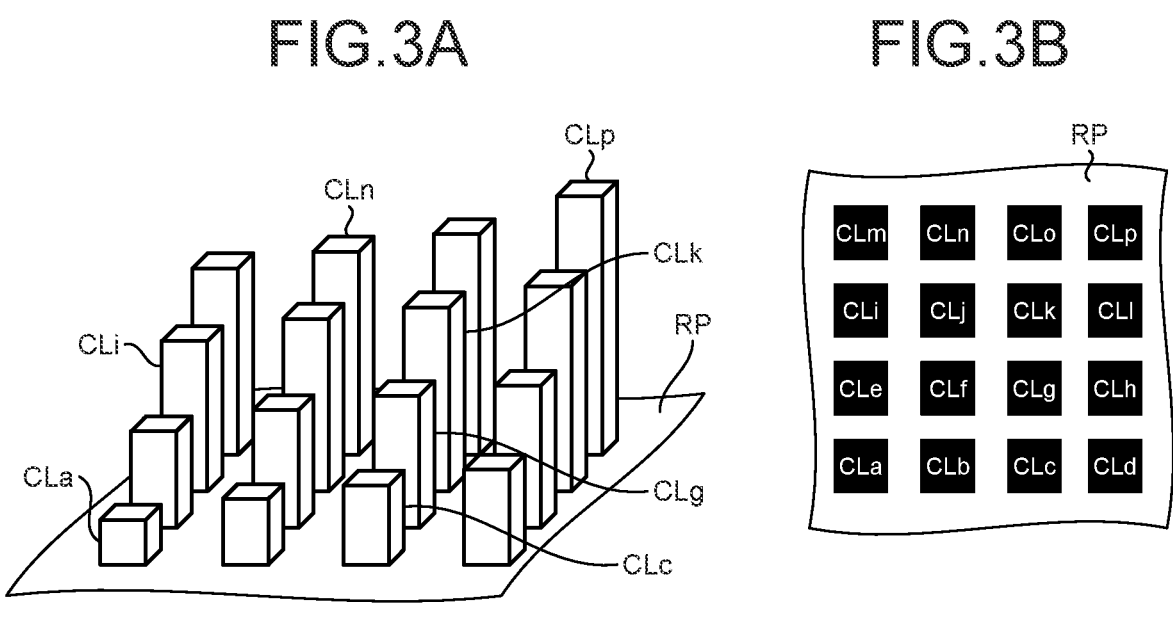
FIGS. 3A to 3C are schematic diagrams illustrating an exemplary configuration of a template according to an embodiment.

FIGS. 3A to 3C are schematic diagrams illustrating an exemplary configuration of the template TM according to an embodiment. FIG. 3A is a perspective view of the template TM on a reference plane RP, and FIG. 3B is a top view of the reference plane RP. FIG. 3C is a cross-sectional view illustrating the whole configuration of the template TM.

As illustrated in FIG. 3C, the template TM according to an embodiment includes a transparent substrate BA made of quartz or the like. The transparent substrate BA has a mesa portion MS that protrudes from the front surface, which is one surface of the transparent substrate BA, and a reference plane RP. A counterbore CN is defined on the back side of the transparent substrate BA. Such a configuration forms a recessed central portion of the rear surface of the transparent substrate BA.

Moreover, although the description below is given of the case where the reference plane RP is a plane that exists on the mesa portion MS as described above, the reference plane RP can be a plane that exists on a portion other than the mesa portion MS or can be a virtual plane that does not exist in the template TM.

Multiple columnar patterns CL (CLa, CLb, CLc, ...) with different heights protrude from the reference plane RP of the mesa portion MS. These columnar patterns CL are, for example, quadrangular columns having substantially the same or similar area occupied on the reference plane RP and different heights. In addition, the number of these columnar patterns CL is, for example, approximately several tens to hundreds.

FIGS. 3A and 3B illustrate some of the multiple columnar patterns CL. As illustrated in FIGS. 3A and 3B, the columnar patterns CLa to CLd among the multiple columnar patterns CL are arranged in a row such that, for example, the height from the reference plane RP increases sequentially in one direction. In these columnar patterns CLa to CLd, the difference in heights between adjacent columnar patterns CL is, for example, approximately several nanometers (nm) to several tens of nanometers.

In the direction intersecting the array of the columnar patterns CLa to CLd, columnar patterns CLe to CLh are arranged in a row adjacent to the columnar patterns CLa to CLd such that the height from the reference plane RP increases, which is similar to the columnar patterns CLa to CLd. The lowest columnar pattern CLe among the columnar patterns CLe to CLh protrudes from the reference plane RP higher than the highest columnar pattern CLd among the columnar patterns CLa to CLd. The difference in height between the columnar patterns CLd and CLe is, for example, approximately several nanometers (nm) to several tens of nanometers.

In this way, the multi-row columnar patterns CLa to CLd, CLe to CLh, CLi to CLl, CLm to CLp, . . . , which sequentially increase in height in one direction, are arranged on the reference plane RP of the template TM in a direction intersecting with their arrangement direction.

However, the arrangement order, arrangement position, or the like of the multiple columnar patterns CL illustrated in FIGS. 3A and 3B is merely illustrative, and the multiple columnar patterns CL of the template TM can have a different order or arrangement from the above disclosure.

In one example, FIGS. 4 to 9 illustrate examples in which the template TM having such multiple columnar patterns CL is inspected by the inspection apparatus 1 according to an embodiment. FIGS. 4 to 9 are diagrams illustrated to describe sequential examples of how to inspect the template TM by the inspection apparatus 1 according to an embodiment.

Figure 4:
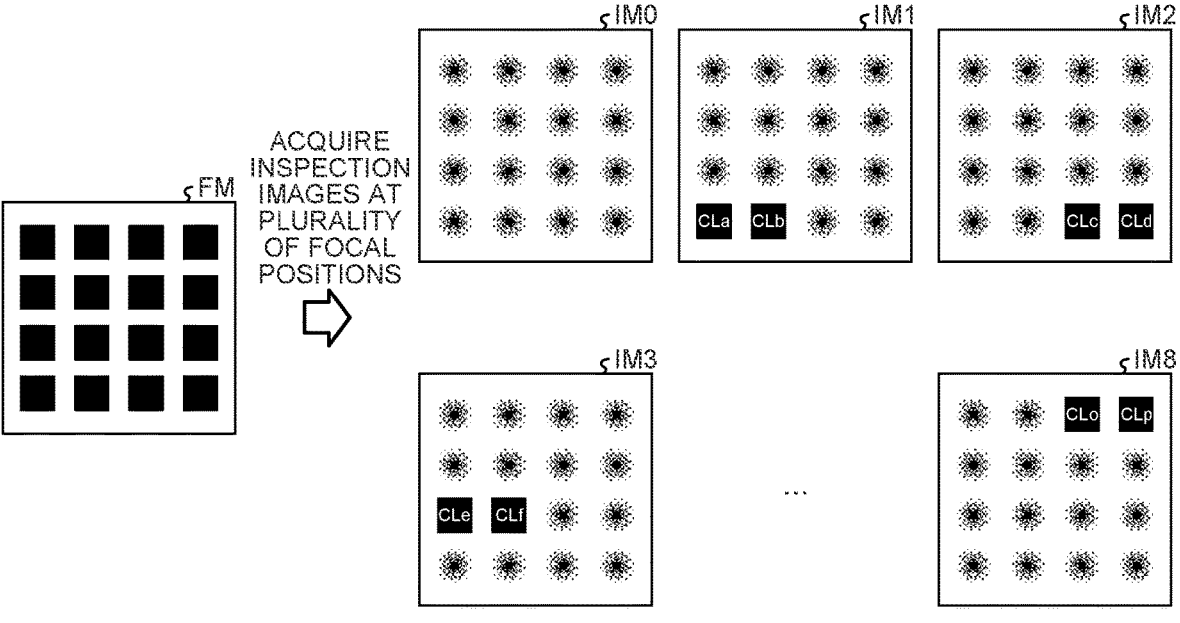
FIG. 4 is a diagram illustrated to describe sequential examples of how to inspect the template by the inspection apparatus according to an embodiment.

As illustrated in FIG. 4, the 16 columnar patterns CLa to CLp illustrated in FIG. 3B described above can be set to fit within the range captured by the imaging unit 11 at one time, that is, a frame FM of the imaging unit 11.

In an optical defect inspection apparatus such as the inspection apparatus 1, the focal depth of light used for inspection is herein approximately 50 to 200 nanometers (nm), for example, approximately 50 nm. In other words, regarding this focal depth, the height that is focusable in one-time image-capturing is, for example, within the range of 50 to 200 nanometers (nm). Thus, it can be challenging in some cases to focus on all the columnar patterns CLa to CLp that fit within one image.

Thus, the inspection apparatus 1 captures a region that includes these columnar patterns CLa to CLp multiple times while changing the relative position between the template TM and the objective lens 14j.

More specifically, in inspecting of the template TM for defects, the focus decision unit 206 of the overall controller 20 that controls the inspection apparatus 1 decides a plurality of target values of the relative position between the template TM and the objective lens 14j in the height direction on the basis of height information included in the design data acquired by the design data acquisition unit 205.

In this event, the focus decision unit 206 calculates the number of target values that can be necessary to focus on the upper-end portions of the respective multiple columnar patterns CL. The required number of target values, that is, the number of times (the number of steps) of changing the relative position between the template TM and the objective lens 14j in capturing the template TM is calculable using, for example, the focal depth of light used during the inspection, the highest columnar pattern CL, and the lowest columnar pattern CL among the multiple columnar patterns CL. In other words, the relative position between the template TM and the objective lens 14j based on the respective target values can also be focal positions where the upper-end portions of the multiple columnar patterns CL are focused.

Capturing a plurality of images at a plurality of relative positions in the height direction decided by the manner described above while sequentially focusing the objective lens 14j allows all the multiple columnar patterns CL to be captured, with any one of the plurality of images being in focus.

Moreover, in a case where the design data is CAD data and the like or similar cases, the height information can be indicated by the number of layers (number of layers) or the like from the reference plane RP of the multiple columnar patterns CL. In this case, the focus decision unit 206 can calculate the height positions of the respective multiple columnar patterns CL using the thickness of one layer.

The inspection unit 201 sends a control signal used to drive the driving mechanism 16 to the stage controller 23 provided in the inspection mechanism 10 on the basis of information regarding the plurality of target values decided from the design data. The stage controller 23 controls the driving mechanism 16 in accordance with a command from the inspection unit 201 so that the driving mechanism 16 moves the stage 13 up and down. Such a configuration allows the relative position between the template TM and the objective lens 14*j* to be changed, adjusting the focal position of the light incident on the template TM.

Further, the inspection unit 201 sends the control signal to the stage controller 23 and sends a control signal used to operate the imaging unit 11 to the imaging controller 21 provided in the inspection mechanism 10. The imaging controller 21 operates the imaging unit 11 in tune with the vertical movement of the stage 13 by the stage controller 23 in accordance with a command from the inspection unit 201, causing the imaging unit 11 to capture a plurality of images IM0 to IM8. Such a configuration allows the plurality of images IM0 to IM8 focused on the predetermined columnar pattern CL to be acquired at the respective relative positions between the template TM and the objective lens 14*j* based on the plurality of target values.

The image IM0 of the plurality of images IM0 to IM8 is herein an image captured by focusing on the vicinity of the height position of the reference plane RP. Thus, none of the multiple columnar patterns CLa to CLp included in the image IM0 is in focus. However, the arrangement positions of these columnar patterns CLa to CLp are recognizable from the image IM0.

Further, the image IM1 is an image captured by focusing on the vicinity of the height positions of the upper-end portions of the columnar patterns CLa and CLb of the multiple columnar patterns CLa to CLp. In other words, in the image IM1, the columnar patterns CLa and CLb of the multiple columnar patterns CLa to CLp included in the image IM1 are in focus.

Moreover, strictly speaking, the columnar pattern CLa and the columnar pattern CLb have different height positions in focus. However, if the height difference between the columnar patterns CLa and CLb is within the specification of the focal depth of light used for the inspection, the respective columnar patterns CLa and CLb are recognizable as being in focus.

In other words, the predetermined columnar pattern CL being in focus means that, for example, its focus is such that satisfactory accuracy is obtainable for the defect inspection. The sensitivity of the image with which the accuracy required for inspection is obtainable can be defined, for example, by the amount of variation in contrast at the boundary portion of the columnar pattern CL in the image.

As described above, the focus decision unit 206 specifies the number of columnar patterns CL capable of being focused in each image-capturing and decides the number of target values necessary for the inspection regarding the relative position between the template TM and the objective lens 14*j* on the basis of the performance of the imaging unit 11, the focal depth of light used for the inspection, or the like. Thus, the number of in-focus columnar patterns CL included in one image can vary depending on the performance of the imaging unit 11, the focal depth of light used for inspection, or the like, regardless of the example in FIG. 4.

The images IM2 to IM8 are, similar to the image IM1, images captured by focusing on the vicinity of the height positions of the upper-end portions of the columnar patterns CLc and CLd, the columnar patterns CLe and CLf, the columnar patterns CLg and CLh, the columnar patterns CLi and CLj, the columnar patterns CLk and CL1, and the columnar patterns CLo and CLp among the multiple columnar patterns CLa to CLp.

Such a configuration allows all the multiple columnar patterns CLa to CLp included in one image to be captured, with any of the images IM1 to IM8 being in focus.

Figure 5:
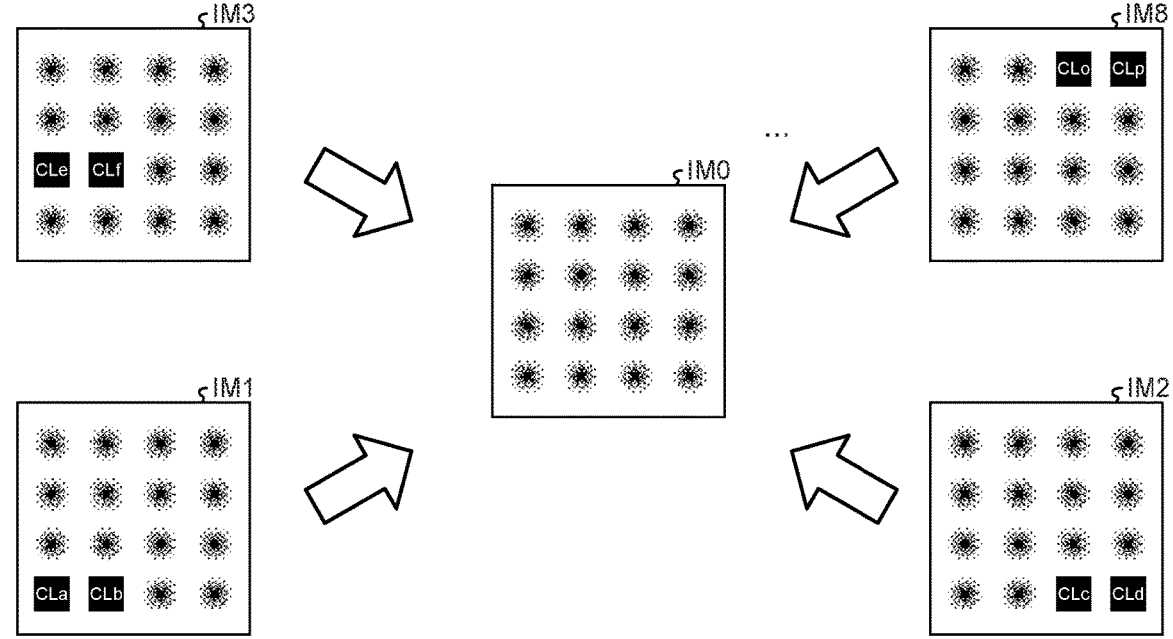
FIG. 5 is a diagram illustrated to describe sequential examples of how to inspect the template by the inspection apparatus according to an embodiment.

As illustrated in FIG. 5, the overall controller 20 of the inspection apparatus 1 synthesizes these images IM0 to IM8. In this event, the overall controller 20 uses the image IM0, which is not focused on any of the columnar patterns CL, as a reference image and applies some of the other respective images IM1 to IM8 to the reference image. More details thereof are illustrated in FIGS. 6 to 9.

Figure 6:
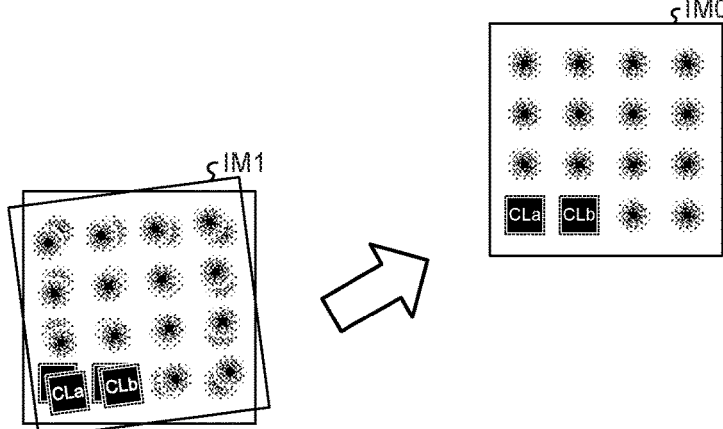
FIG. 6 is a diagram illustrated to describe sequential examples of how to inspect the template by the inspection apparatus according to an embodiment.

As illustrated in FIG. 6, the image synthesis unit 207 of the overall controller 20 corrects, for example, the luminance, magnification, and deviation in the image-capturing position of the image IM1 in vertical, horizontal, and rotational directions as necessary. In one example, the luminance between the images IM1 to IM8 is likely to vary with time. The imaging position is likely to deviate due to, for example, vibration or the like of the stage 13. The image synthesis unit 207 corrects the luminance, magnification, and deviation in the imaging position of the images IM1 to IM8 before synthesizing.

In the example of FIG. 6, given that the imaging position of the image IM1 deviates in the rotational direction, it is possible to determine the deviation in the imaging position on the basis of, for example, the design data. The image synthesis unit 207 rotates the image IM1 in a direction opposite to the direction where the position deviates for correction.

Further, the image synthesis unit 207 extracts a region that includes the columnar pattern CL in which the upper-end portion is in focus from among the multiple columnar patterns CLa to CLp included in the corrected image IM1. The image IM1 is an image captured by focusing on the upper-end portions of the columnar patterns CLa and CLb. Thus, the image synthesis unit 207 extracts a region that includes the columnar patterns CLa and CLb from the image IM1.

The region to be extracted in the image IM1 can be determined on the basis of, for example, the design data for the template TM. The design data includes, for example, coordinates of the multiple columnar patterns CLa to CLp on the reference plane RP and height information associated with those coordinates. Thus, the image synthesis unit 207 refers to which position in the height direction the image IM1 is focused on and captured and collates the coordinates on the reference plane RP to which the height information corresponding to the focal position is linked, specifying the region that includes the columnar patterns CLa and CLb to be extracted.

The image synthesis unit 207 applies the region that includes the columnar patterns CLa and CLb extracted from the image IM1 to the image IM0, which is the reference image. As described above, in the image IM0, all the columnar patterns CLa to CLp are out of focus. However, the arrangement positions of the individual columnar patterns CLa to CLp are identifiable on the image IM0, so it is possible to apply the regions extracted from the image IM1 to the arrangement positions of the columnar patterns CLa and CLb on the image IM0.

Figure 7:
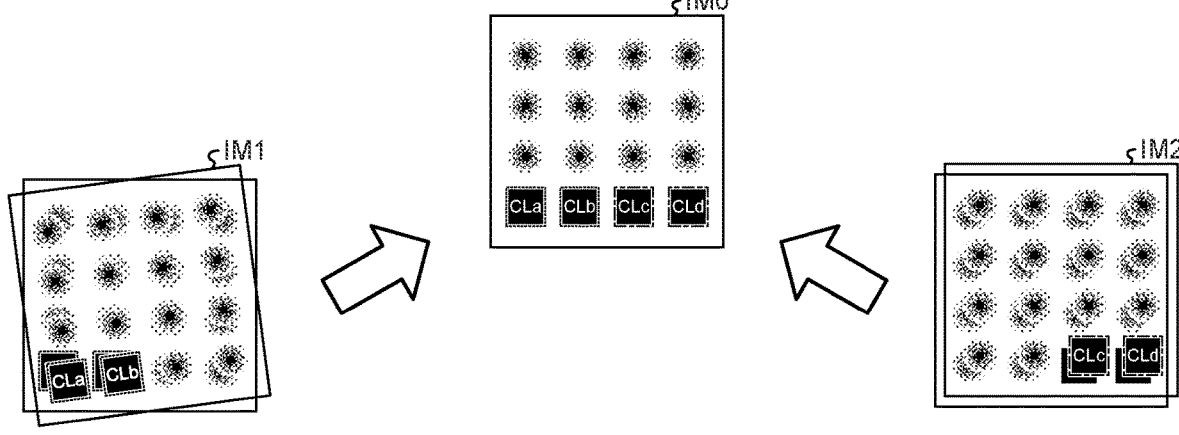
FIG. 7 is a diagram illustrated to describe sequential examples of how to inspect the template by the inspection apparatus according to an embodiment.

As illustrated in FIG. 7, the image synthesis unit 207 corrects, for example, the luminance, magnification, and deviation in the imaging position in the vertical, horizontal, and rotational directions of the image IM2. In the example of FIG. 7, it is assumed that the image IM2 has a deviation in the imaging position in the vertical and horizontal directions. The image synthesis unit 207 determines such a deviation in imaging positions on the basis of, for example, the design data and shifts the image IM2 in a direction opposite to the direction of the positional deviation for correction.

Further, the image synthesis unit 207 extracts a region that includes the columnar patterns CLc and CLd focused on the upper-end portion from among the multiple columnar patterns CLa to CLp included in the corrected image IM2 on the basis of a focal position of the image IM2 upon being captured and coordinates associated with the height information corresponding to the focal position. The image synthesis unit 207 applies the regions extracted from the image IM2 to the arrangement positions of the columnar patterns CLc and CLd on the image IM0.

Figure 8:
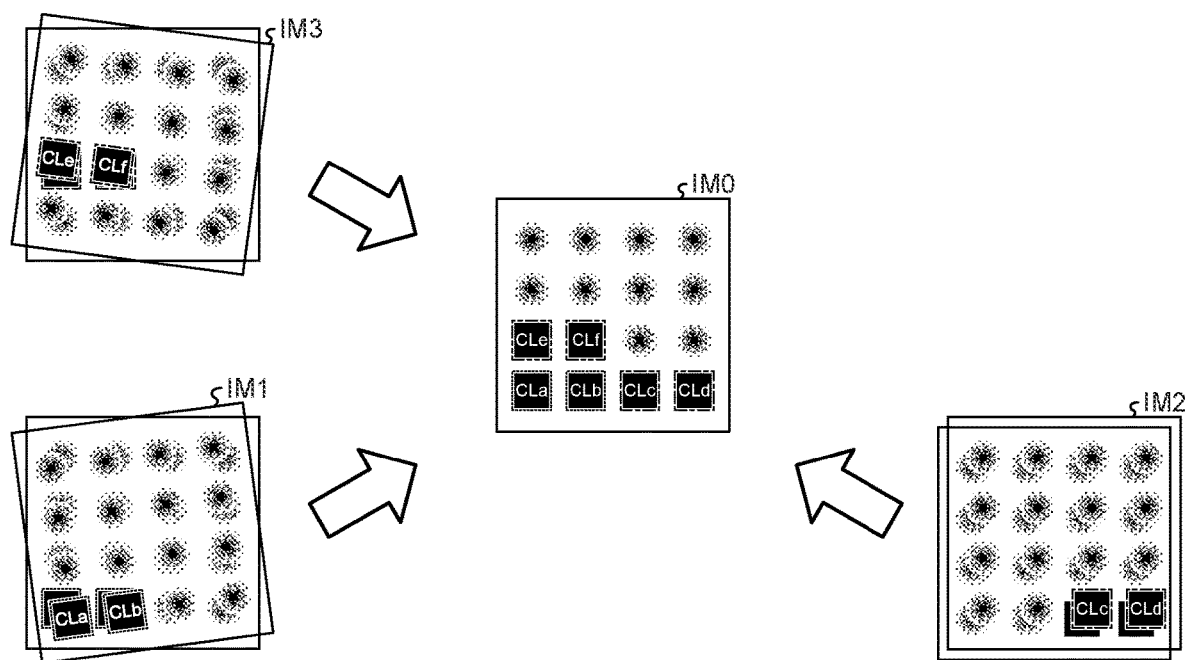
FIG. 8 is a diagram illustrated to describe sequential examples of how to inspect the template by the inspection apparatus according to an embodiment.

As illustrated in FIG. 8, the image synthesis unit 207 corrects the luminance, magnification, and deviation in the imaging position of the image IM3. In the example of FIG. 8, it is assumed that the image IM3 has a deviation in its imaging position in the rotational direction. The image synthesis unit 207 determines such a deviation in imaging positions on the basis of, for example, the design data and rotates the image IM3 in a direction opposite to the direction of the positional deviation for correction.

Further, the image synthesis unit 207 extracts a region that includes the columnar patterns CLe and CLf focused on the upper-end portion from among the multiple columnar patterns CLa to CLp included in the corrected image IM3 on the basis of a focal position of the image IM3 upon being captured and coordinates associated with the height information corresponding to the focal position. The image synthesis unit 207 applies the regions extracted from the image IM3 to the arrangement positions of the columnar patterns CLe and CLf on the image IM0.

The image synthesis unit 207 performs processing similar to the above description for the images IM4 to IM7. In other words, the luminance, magnification, deviation in the imaging position, and the like of the images IM4 to IM7 are individually corrected. From the corrected images IM4 to IM7, a region that includes the in-focus columnar patterns CL is extracted. The extracted regions are applied to the corresponding positions in the image IM0.

Figure 9:
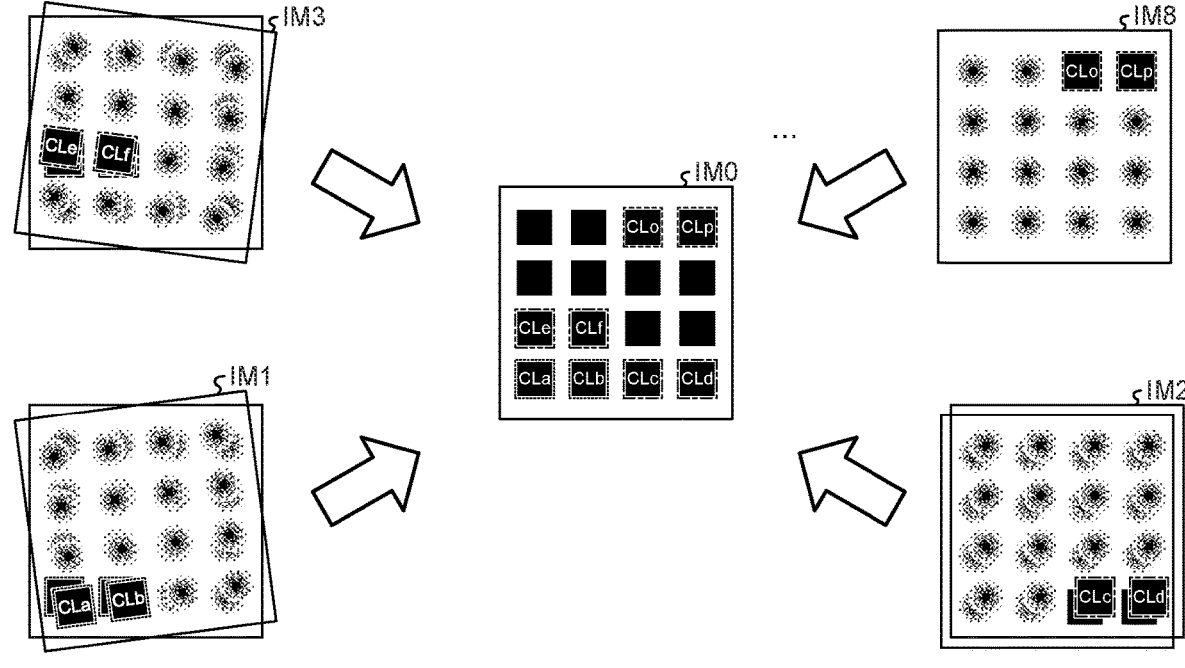
FIG. 9 is a diagram illustrated to describe sequential examples of how to inspect the template by the inspection apparatus according to an embodiment.

As illustrated in FIG. 9, the image synthesis unit 207 corrects the luminance, magnification, and deviation in the imaging position of the image IM8. In the example of FIG. 9, it is assumed that the image IM8 has no deviation in its imaging position. The image synthesis unit 207 determines the presence or absence of a deviation in the imaging position of the image IM8 on the basis of the design data. If there is no position deviation, the image synthesis unit 207 corrects only the luminance and magnification rather than deviation.

Further, the image synthesis unit 207 extracts a region that includes the columnar patterns CLo and CLp focused on the upper-end portion from among the multiple columnar patterns CLa to CLp included in the corrected image IM8 on the basis of a focal position of the image IM8 upon being captured and coordinates associated with the height information corresponding to the focal position. The image synthesis unit 207 applies the regions extracted from the image IM8 to the arrangement positions of the columnar patterns CLo and CLp on the image IM0.

As described above, the processing illustrated in FIGS. 6 to 9 generates a synthetic image in which all the multiple columnar patterns CLa to CLp are in focus. In combining the images IM1 to IM8 on the image IM0, the luminance, magnification, and deviation in the imaging position of the images IM1 to IM8 are corrected as described above. Thus, differences in lightness, positional deviations, and the like at the boundaries of these images IM1 to IM8 are reduced or prevented.

Moreover, in FIGS. 6 to 9, the multiple columnar patterns CLa to CLp are applied to the image IM0, which is the reference image, in order from the lowest side, but the order of applying the images IM1 to IM8 is not limited to the example described above and is optional.

The defect determination unit 208 determines the presence or absence of any defect in the multiple columnar patterns CLa to CLp using the generated synthetic image.

In this event, the defect determination unit 208 performs a comparison of adjacent columnar patterns CL or a comparison of one columnar pattern CL with its surrounding multiple columnar patterns CL, or the like among the multiple columnar patterns CLa to CLp. Such a configuration enables the determination of the presence or absence of any defective formation of the columnar pattern CL in the template TM, foreign matter on the template TM, and other defects.

As described above, the technique of performing the defect inspection by comparing multiple patterns in one image is sometimes called cell-to-cell inspection.

(Method of Manufacturing Template)

The above-described inspection for any defect of the template TM by the inspection apparatus 1 according to an embodiment is performed to check the quality of the template TM on which the multiple columnar patterns CL are formed, for example, as part of the manufacturing process of the template TM. A method of manufacturing the template TM to be inspected for defects and a master template TMm used for manufacturing the template TM is now described below with reference to FIGS. 10A to 13C.

In one example, in manufacturing the template TM, a master template TMm, which is the original plate of the template TM, is first manufactured. A plurality of templates TM can be manufactured from one master template TMm.

FIGS. 10A to 10E are cross-sectional views illustrating part of the process of a method of manufacturing the master template TMm according to an embodiment. FIGS. 10A to 10E illustrate enlarged cross-sectional views of a mesa portion MSm of the master template TMm during manufacturing.

Figures 10A, 10B, 10C, 10D, 10E:
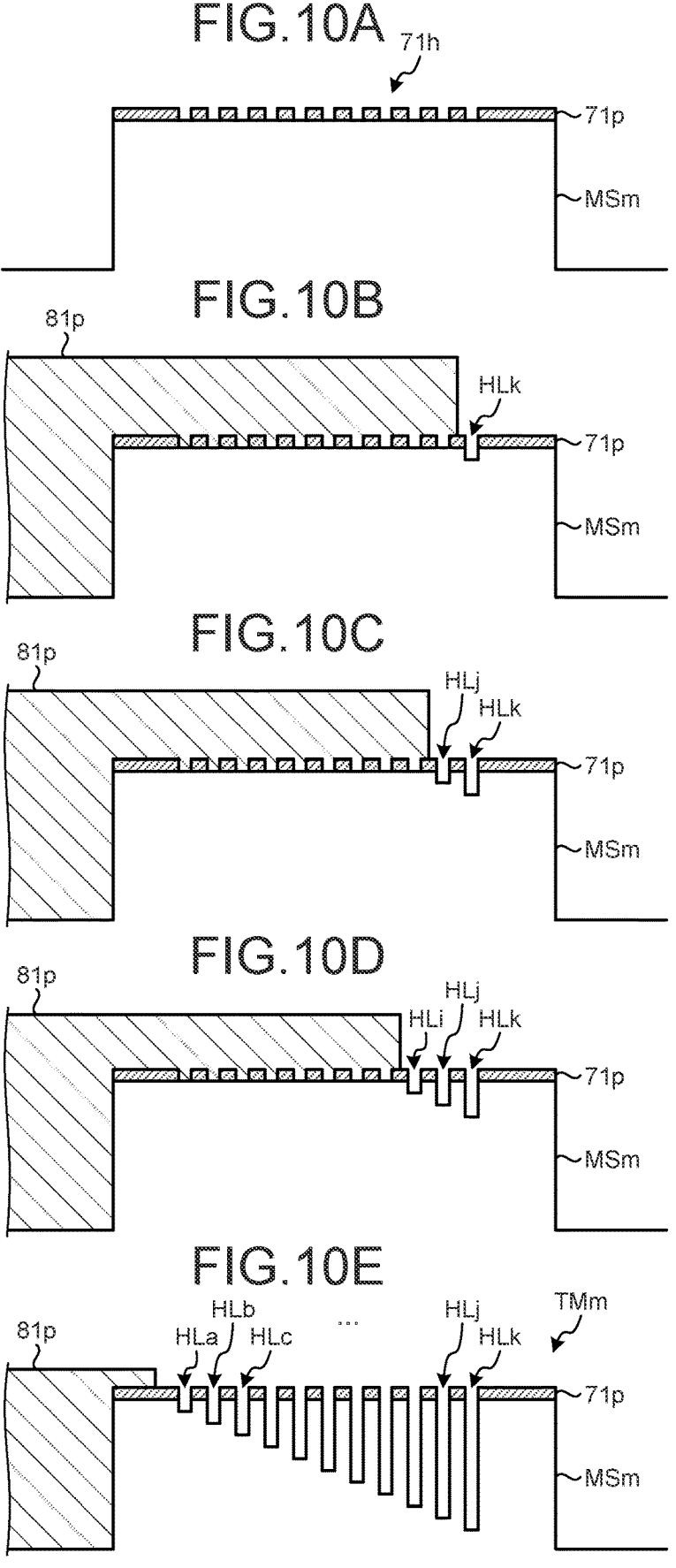
FIGS. 10A to 10E are cross-sectional views illustrating part of the process of a method of manufacturing a master template according to an embodiment.

As illustrated in FIG. 10A, the mesa portion MSm protruding from the surface of a transparent substrate of the master template TMm is formed, the upper surface of the mesa portion MSm is covered with a mask film such as a chromium film, and a mask pattern 71p having a plurality of hole patterns 71h is formed. In this event, the upper surface of the transparent substrate other than the mesa portion MSm can be covered with the mask film such as a chromium film (not illustrated).

The mesa portion MSm of the transparent substrate is formed, for example, by grinding the transparent substrate by machining. The plurality of hole patterns 71h are formed by processing the mask film by, for example, the electron-beam drawing technique using electron beams or the like.

As illustrated in FIG. 10B, a resist pattern 81p that covers part of the mask pattern 71p is formed on the upper surface of the mesa portion MSm. The resist pattern 81p is formed by coating the transparent substrate with a resist film, such as a photosensitive organic film, and exposing a portion of the resist film to light.

Further, the mesa portion MSm is processed via the mask pattern 71p exposed from the resist pattern 81p to form a hole pattern HLk reaching a predetermined depth of the mesa portion MSm.

As illustrated in FIG. 10C, the resist pattern 81$p$ is slimmed by oxygen plasma or the like. Such processing allows the end portion of the resist pattern 81$p$ on the mask pattern 71$p$ to recede, further exposing the mask pattern 71$p$.

Further, the mesa portion MSm is processed via the mask pattern 71$p$ exposed from the resist pattern 81$p$ to form a hole pattern HLj reaching a predetermined depth of the mesa portion MSm. In this event, the hole pattern HLk that has already formed is processed deeper. As a result, the hole patterns HLj and HLk having different reaching depths in a mesa portion MRs are formed.

As illustrated in FIG. 10D, the resist pattern 81$p$ is slimmed by oxygen plasma or the like to recede additionally at the end portion of the resist pattern 81$p$, further exposing the mask pattern 71$p$.

Further, the mesa portion MSm is processed via the mask pattern 71$p$ exposed from the resist pattern 81$p$ to form a hole pattern HLi reaching a predetermined depth of the mesa portion MSm. In this event, the hole patterns HLj and HLk that have already formed are processed deeper, and the hole patterns HLi, HLj, and HLk whose reaching depths in the mesa portion MSm increase in order are formed.

As illustrated in FIG. 10E, the slimming of the resist pattern 81$p$ and the processing of the mesa portion MSm are repeated to form a plurality of hole patterns HLa to HLk whose reaching depths in the mesa portion MSm increase in order. Such processing allows the master template TMm to be manufactured. Then, the remaining resist pattern 81$p$ and mask pattern 71$p$ are removed.

Moreover, the hole patterns HLa to HLk with increasing depths are illustrated in one cross-section in FIGS. 10A to 10E for convenience of description. However, the number and arrangement of the hole patterns HL formed in the master template TMm are optionally determined depending on the number and arrangement of the columnar patterns CL formed on the template TM.

The template TM according to an embodiment is manufactured by performing imprinting processing described below using the master template TMm manufactured as described above.

FIGS. 11A to 13C are cross-sectional views sequentially illustrating part of the process of the method of manufacturing the template TM according to an embodiment. FIGS. 11A to 13C illustrate enlarged cross-sectional views of a mesa portion MS of the template TM during manufacturing.

Figure 11A:
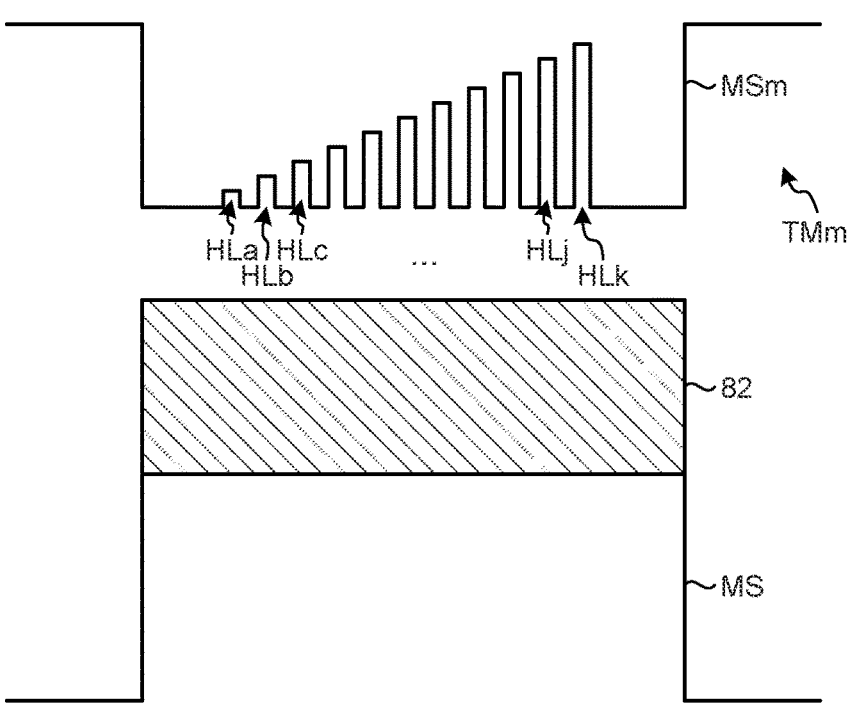
FIGS. 11A and 11B are cross-sectional views sequentially illustrating part of the process of the method of manufacturing a template according to an embodiment.

As illustrated in FIG. 11A, the mesa portion MS protruding from the surface of the transparent substrate BA (see FIG. 3C) of the template TM is formed, and the upper surface of the mesa portion MS is covered with a resist film 82. In this event, the upper surface of the transparent substrate BA, other than the mesa portion MS, can be covered with a mask film such as a chromium film (not illustrated).

The mesa portion MS of the transparent substrate BA is formed, for example, by grinding the transparent substrate BA by machining, which is similar to the case of the master template TMm described above. The resist film 82 is, for example, a photocurable resin film or the like that is cured by irradiation with ultraviolet rays or the like. The resist film 82 is formed by applying a resist material by spin coating or the like or dripping the resist material by the inkjet technique. In this event, the resist film 82 is in an uncured state.

The master template TMm is made to be opposed to the resist film 82 with the surface on which the hole patterns HLa to HLk are formed facing the template TM to transfer the hole patterns HLa to HLk of the master template TMm to the resist film 82.

Figure 11B:
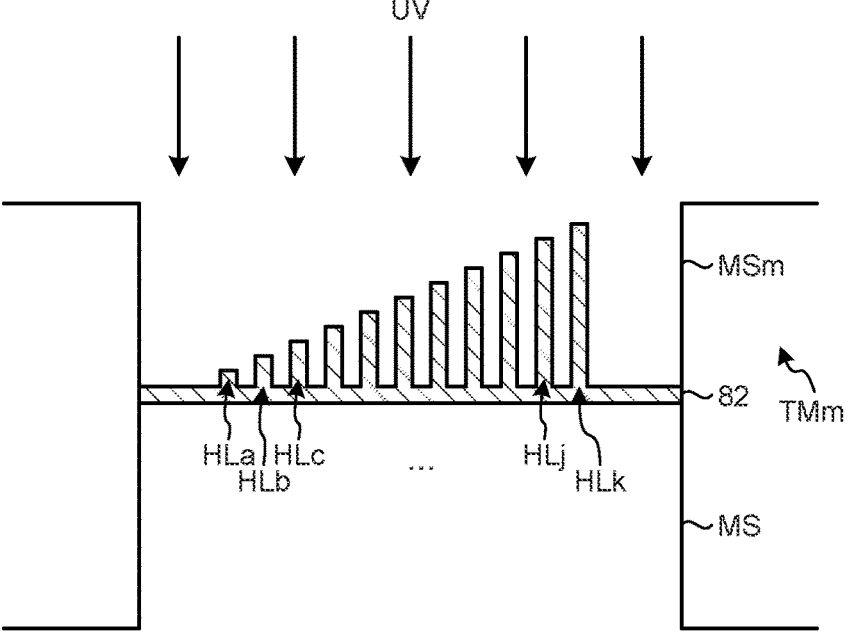

As illustrated in FIG. 11B, the hole patterns HLa to HLk of the master template TMm are pressed against the resist film 82 on the mesa portion MS. In this event, a gap of such a degree that the mesa portion MSm of the master template TMm does not come into contact with the mesa portion MS of the template TM is provided between these mesa portions MSm and MS.

Such processing allows a part of the resist film 82 to be filled in the hole patterns HLa to HLk of the master template TMm. In this state, the resist film 82 is irradiated with light such as ultraviolet light transmitted through the master template TMm while pressing the master template TMm against the resist film 82, curing the resist film 82.

Figure 12A:
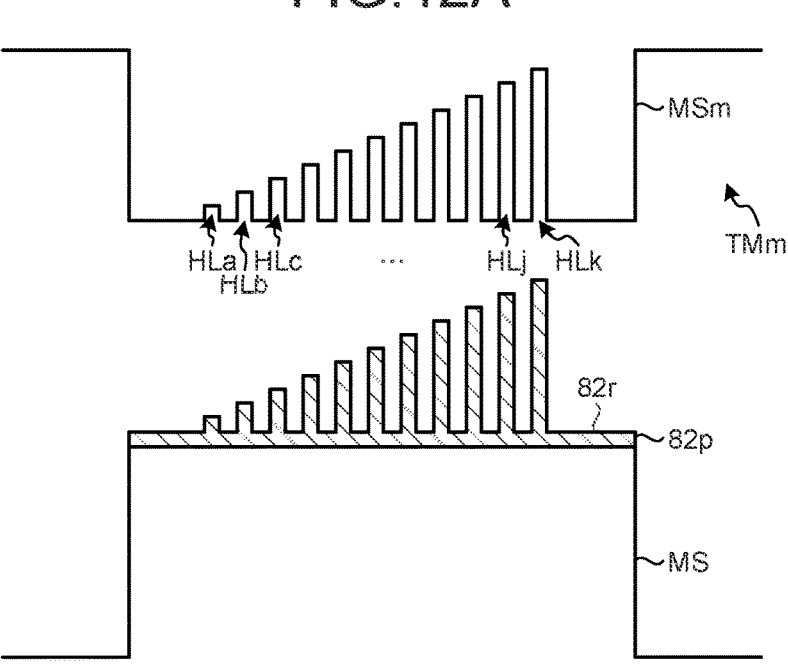
FIGS. 12A to 12C are cross-sectional views sequentially illustrating part of the process of the method of manufacturing a template according to an embodiment.

As illustrated in FIG. 12A, the master template TMm is released from a mold, forming a resist pattern 82$p$ to which the hole patterns HLa to HLk of the master template TMm are transferred. As described above, the resist film 82 is cured with a gap provided between the mesa portion MSm of the master template TMm and the mesa portion MS of the template TM, and so the resist pattern 82$p$ has a residual resist film 82$r$ connecting the bottoms of the transferred patterns.

Figure 12B:
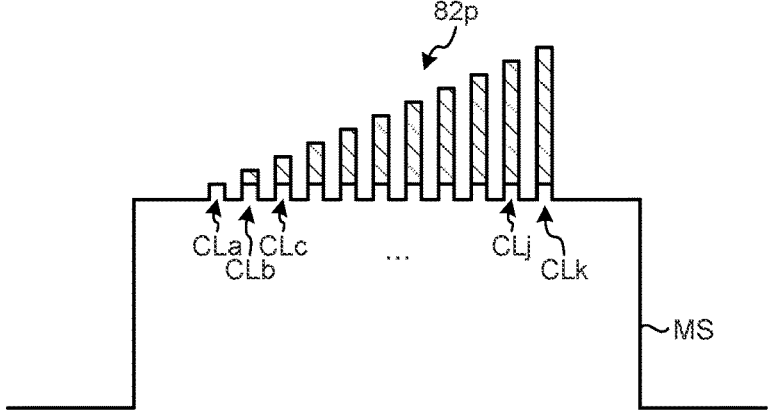

As illustrated in FIG. 12B, the residual resist film 82$r$ on the bottom of each pattern is removed using oxygen plasma or the like. In addition, the mesa portion MS is processed through the resist pattern 82$p$. Such processing allows the film thickness of the resist pattern 82$p$ to be reduced and the upper surface of the mesa portion MS exposed from the resist pattern 82$p$ to be removed, forming multiple columnar patterns CLa to CLk to which the resist pattern 82$p$ is transferred.

Further continuous processing of the mesa portion MS through the resist pattern 82$p$ causes the resist pattern 82$p$ with the thinnest film thickness on the columnar pattern CLa to disappear.

Figure 12C:
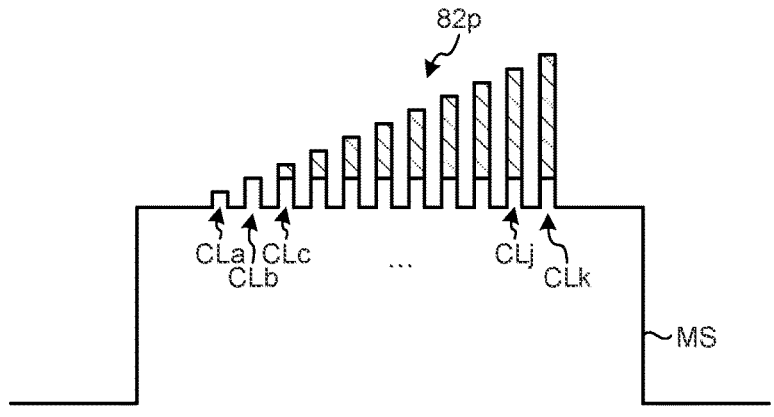

As illustrated in FIG. 12C, the processing of the mesa portion MS through the resist pattern 82$p$ is further continued. Such processing allows the upper surface of the mesa portion MS exposed from the resist pattern 82$p$ to be further removed, relatively increasing the area of protrusion of the multiple columnar patterns CLb to CLk from the upper surface of the mesa portion MS. In addition, the resist pattern 82$p$ on the columnar pattern CLb disappears.

On the other hand, in the columnar pattern CLa where the resist pattern 82$p$ disappears and is exposed, the upper-end portion of the columnar pattern CLa is removed. Thus, the area of protrusion of the columnar pattern CLa from the upper surface of the mesa portion MS becomes smaller than those of the other columnar patterns CLb to CLk.

Figure 13A:
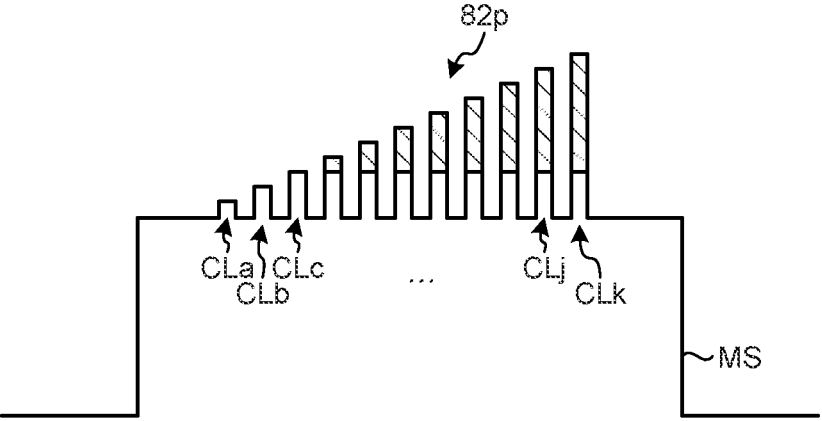
FIGS. 13A to 13C are cross-sectional views sequentially illustrating part of the process of the method of manufacturing a template according to an embodiment.

As illustrated in FIG. 13A, the processing of the mesa portion MS through the resist pattern 82$p$ is further continued. Such processing allows the upper surface of the mesa portion MS exposed from the resist pattern 82$p$ to be further removed, relatively increasing the area of protrusion of the multiple columnar patterns CLc to CLk from the upper surface of the mesa portion MS. In addition, the resist pattern 82$p$ on the columnar pattern CLc disappears.

On the other hand, in the columnar pattern CLb where the resist pattern 82$p$ disappears and is exposed, the upper-end portion of the columnar pattern CLb is removed. Thus, the area of protrusion of the columnar pattern CLb from the upper surface of the mesa portion MS becomes smaller than those of the other columnar patterns CLc to CLk. In addition, in the columnar pattern CLa, the upper-end portion of the columnar pattern CLa is further removed, so the area of protrusion from the upper surface of the mesa portion MS becomes smaller than that of the columnar pattern CLb.

Figure 13B:
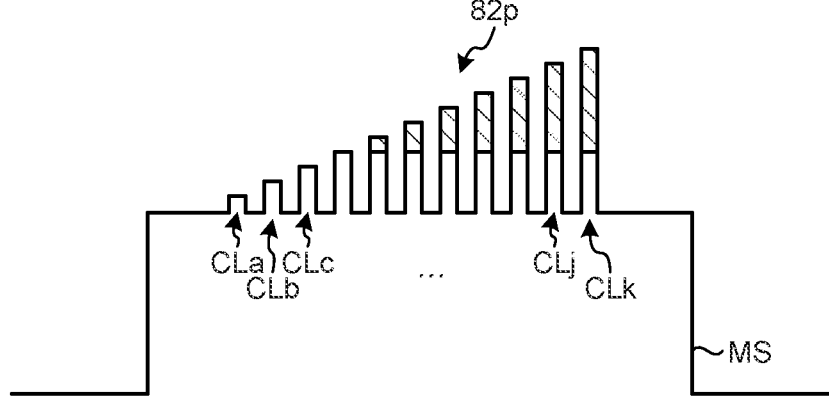

As illustrated in FIG. 13B, the processing of the mesa portion MS through the resist pattern 82*p* is further continued. Such processing allows the area of protrusion of the multiple columnar patterns CL from the upper surface of the mesa portion MS to increase relatively and the resist pattern 82*p* to disappear in order of decreasing film thickness, exposing further some columnar patterns CL among the multiple columnar patterns CL.

Figure 13C:
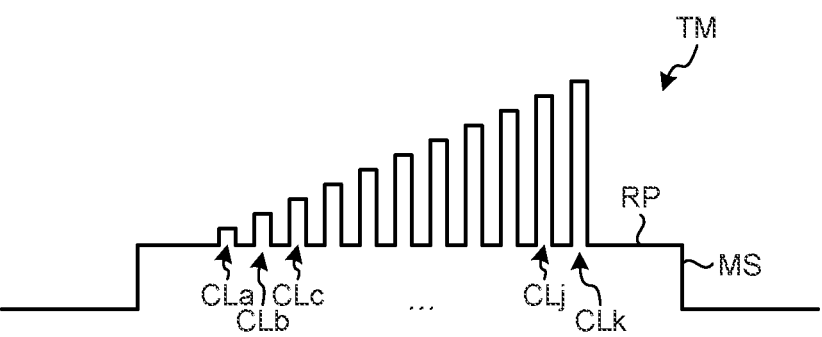

As illustrated in FIG. 13C, the continuous processing described above allows multiple columnar patterns CLa to CLk to be formed in which the area of protrusion from the upper surface of the mesa portion MS increases sequentially from the columnar pattern CLa to the columnar pattern CLk. In addition, the surface of the mesa portion MS exposed in this event corresponds to the reference plane RP described above.

The columnar patterns CLa to CLk with increasing heights are herein illustrated in one cross-section in FIGS. 11A to 13C for convenience of description. However, the number and arrangement of the columnar patterns CL formed on the template TM are optional, and the template TM can have, for example, the configuration of FIGS. 3A to 3C described above or other configurations.

Then, the multiple completed columnar patterns CL are subjected to the defect inspection by the inspection apparatus 1 of an embodiment using the inspection technique illustrated in FIGS. 4 to 9 described above. In a case where a defect is detected in any pattern of the multiple columnar patterns CL during the defect inspection, the template TM with such a pattern is determined to be defective and then discarded or reworked. In a case where no defect is detected during the defect inspection, the template TM is determined as a non-defective product and is used for manufacturing a semiconductor device, which will be described later.

The template TM according to an embodiment is manufactured by the processing operations described above.

Moreover, the method of manufacturing the template TM described above is merely an example, and the template TM according to an embodiment can be manufactured using techniques or methods other than those described above. In one example, without relying on the examples mentioned above, the template TM can be manufactured with no use of the master template TMm.

In this case, for example, the multiple columnar patterns CL can be drawn directly on the upper surface of the mesa portion MS of the transparent substrate BA using electron beams or the like. Alternatively, the multiple columnar patterns CL can be formed using etching by employing a mask pattern of a chromium film or the like and a resist pattern of a resist film or the like.

(Exemplary Usage of Template)

Exemplary usages of the template TM according to an embodiment are now described with reference to FIGS. 14A to 16C. The template TM is used, for example, in performing imprinting processing in the manufacturing process of a semiconductor device, as described above. Thus, the processing of FIGS. 14A to 16C described below, is performed, for example, as part of the method of manufacturing a semiconductor device.

FIGS. 14A to 16C are cross-sectional views sequentially illustrating part of the process of imprint processing using the template TM according to an embodiment.

Figure 14A:
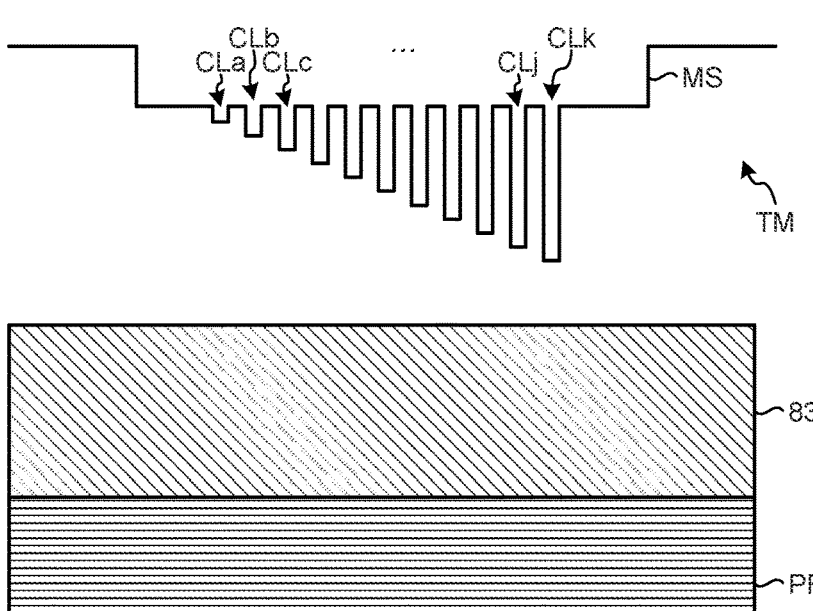
FIGS. 14A and 14B are cross-sectional views sequentially illustrating part of the process of imprinting processing using the template according to an embodiment.

As illustrated in FIG. 14A, a processing-target film PF is formed on an underlying film UF as an object to be subjected to the imprinting processing. The underlying film UF can be a part of the silicon substrate or can be an insulating film such as a silicon oxide film formed on the silicon substrate.

The processing-target film PF can be, for example, a multi-layer film or the like in which insulating layers such as silicon oxide layers and insulating layers such as silicon nitride layers are alternately stacked.

A resist film 83 is further formed on the processing-target film PF. The resist film 83 is, for example, a photocurable resin before being cured or the like and is formed by applying or dropping a resist material, which is similar to the resist film 82 described above.

The template TM is made to be opposed to the resist film 83 with the surface on which the columnar patterns CL are formed facing the processing-target film PF to transfer the multiple columnar patterns CL of the template TM to the resist film 83.

Figure 14B:
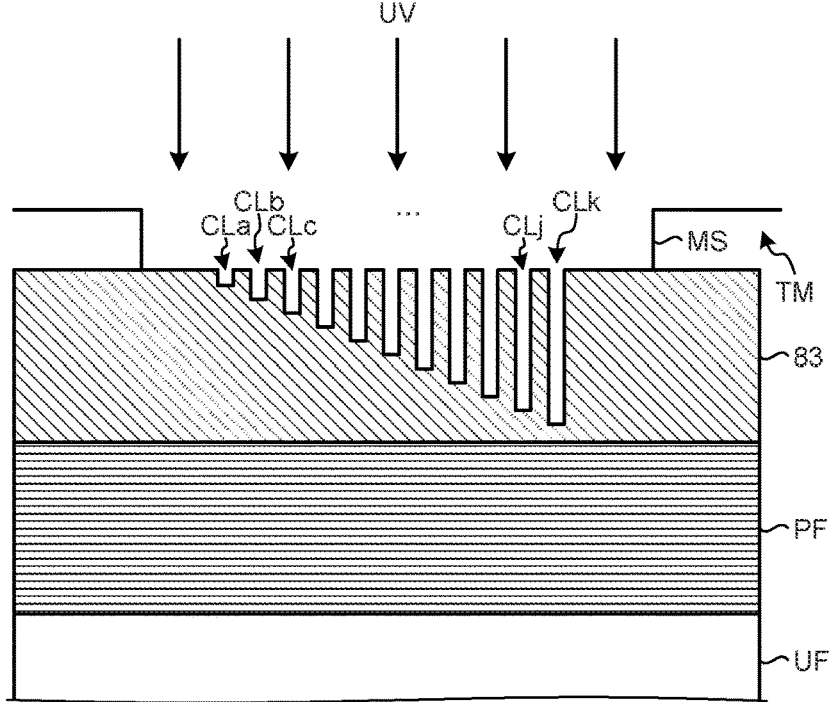

As illustrated in FIG. 14B, the columnar pattern CL of the template TM is pressed against the resist film 83 on the processing-target film PF. In this event, a gap of such a degree that the mesa portion MS of the template TM does not come into contact with the processing-target film PF is provided between the columnar pattern CLk having the largest protrusion area and the processing-target film PF.

In this state, the resist film 83 is irradiated with light such as ultraviolet light transmitted through the template TM while pressing the template TM against the resist film 83, curing the resist film 83.

Figure 15A:
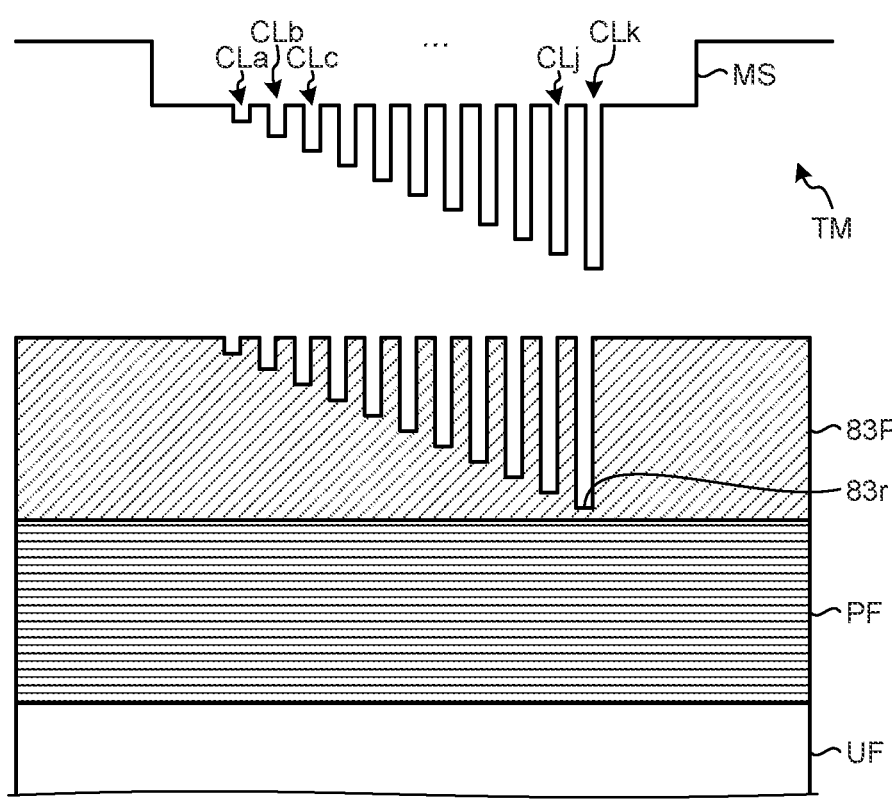
FIGS. 15A and 15B are cross-sectional views sequentially illustrating part of the process of imprint processing using the template according to an embodiment.

As illustrated in FIG. 15A, the template TM is released from a mold, forming a resist pattern 83*p* to which the columnar pattern CL of the template TM is transferred. As described above, the resist film 83 is cured with the gap being provided between the template TM and the processing-target film PF, so the resist pattern 83*p* has a residual resist film 83*r* formed at the bottom of the pattern of the deepest hole among the transferred patterns.

In this regard, the photolithographic technique is challenging to collectively form a resist pattern having multiple patterns with different reaching depths in the resist film, such as the resist pattern 83*p*. For this reason, for example, multiple times of exposure and development processing or the like are required.

As described above, the technique using the template TM allows multiple patterns with different reaching depths in the resist film 83 to be formed in the resist film 83 by one time of the imprinting processing.

Figure 15B:
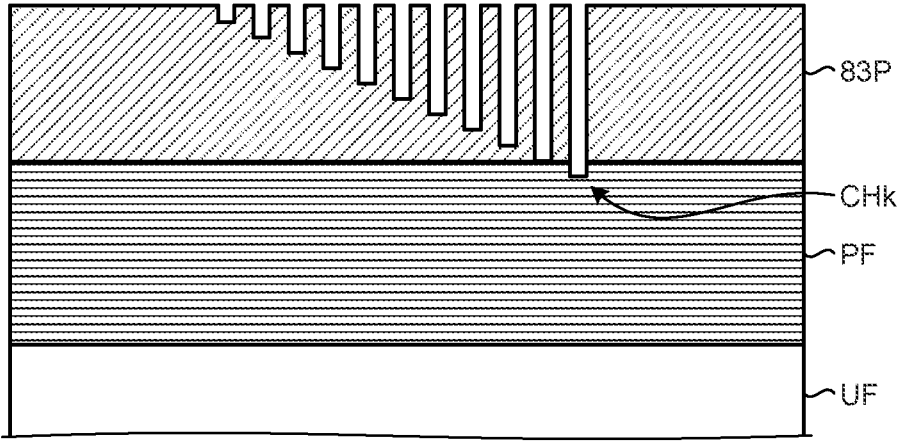

As illustrated in FIG. 15B, the residual resist film 83*r* at the bottom of the pattern of the deepest hole is removed using oxygen plasma or the like. Such processing allows the upper surface of the processing-target film PF to be exposed at the bottom of the pattern of the deepest hole.

Further, the processing on the processing-target film PF through the resist pattern 83*p* allows the processing-target film PF exposed from the resist pattern 83*p* to be removed, forming a hole CHk to which the resist pattern 83*p* of the deepest hole is transferred. In addition, the reduction in the film thickness of the resist pattern 83*p* causes the processing-target film PF to be exposed newly from the bottom of a pattern adjacent to the pattern of the deepest hole.

Figure 16A:
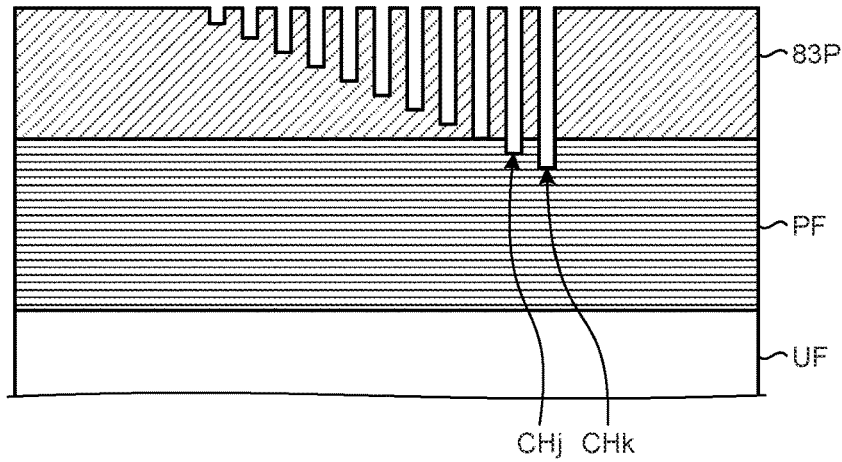
FIGS. 16A to 16C are cross-sectional views sequentially illustrating part of the process of imprint processing using the template according to an embodiment.

As illustrated in FIG. 16A, the processing on the processing-target film PF through the resist pattern 83*p* is further continued. Such processing allows the upper surface of the processing-target film PF exposed newly from resist pattern 83*p* to be removed to form a hole CHj. The reaching depth of the hole CHk in the processing-target film PF further increases. In addition, the film thickness of resist pattern 83*p* reduces, and the processing-target film PF is newly exposed from the bottom of the pattern adjacent to the hole CHj.

Figure 16B:
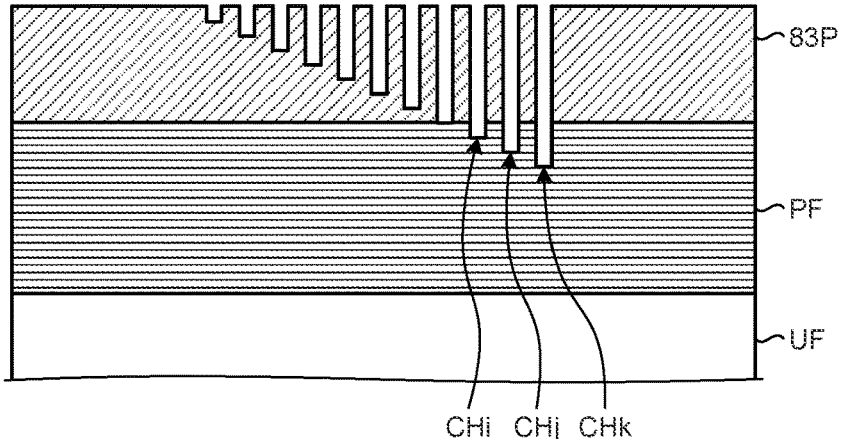

As illustrated in FIG. 16B, the processing on the processing-target film PF through the resist pattern 83*p* is further continued. Such processing allows the reaching depth of the plurality of holes CH in the processing-target film PF further increases, and the processing-target film PF is exposed newly from the bottom of the pattern in descending order of the depth of the pattern transferred by the template TM, forming a new hole CH.

Figure 16C:
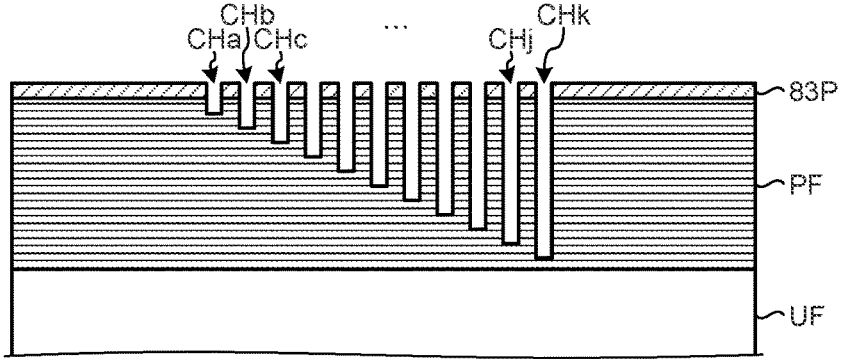

As illustrated in FIG. 16C, the continuous processing described above allows the plurality of holes CHa to CHk whose reaching depths increase sequentially from the hole CHa to the hole CHk to be formed in the processing-target film PF. Then, the remaining resist pattern 83p is removed.

Thus, the imprinting processing using the template TM is terminated.

Moreover, in performing the imprinting processing, for example, the columnar pattern CL of the template TM can be transferred to the resist film 83 in shape with rounded corners. In addition, in forming the plurality of holes CH in the processing-target film PF using the resist pattern 83p, the corners of the holes CH can be further rounded.

(Exemplary Configuration of Semiconductor Device)

An application example of the above-described holes CH formed using the template TM according to an embodiment applied to a semiconductor device is now described with reference to FIGS. 17A and 17B.

Figure 17A:
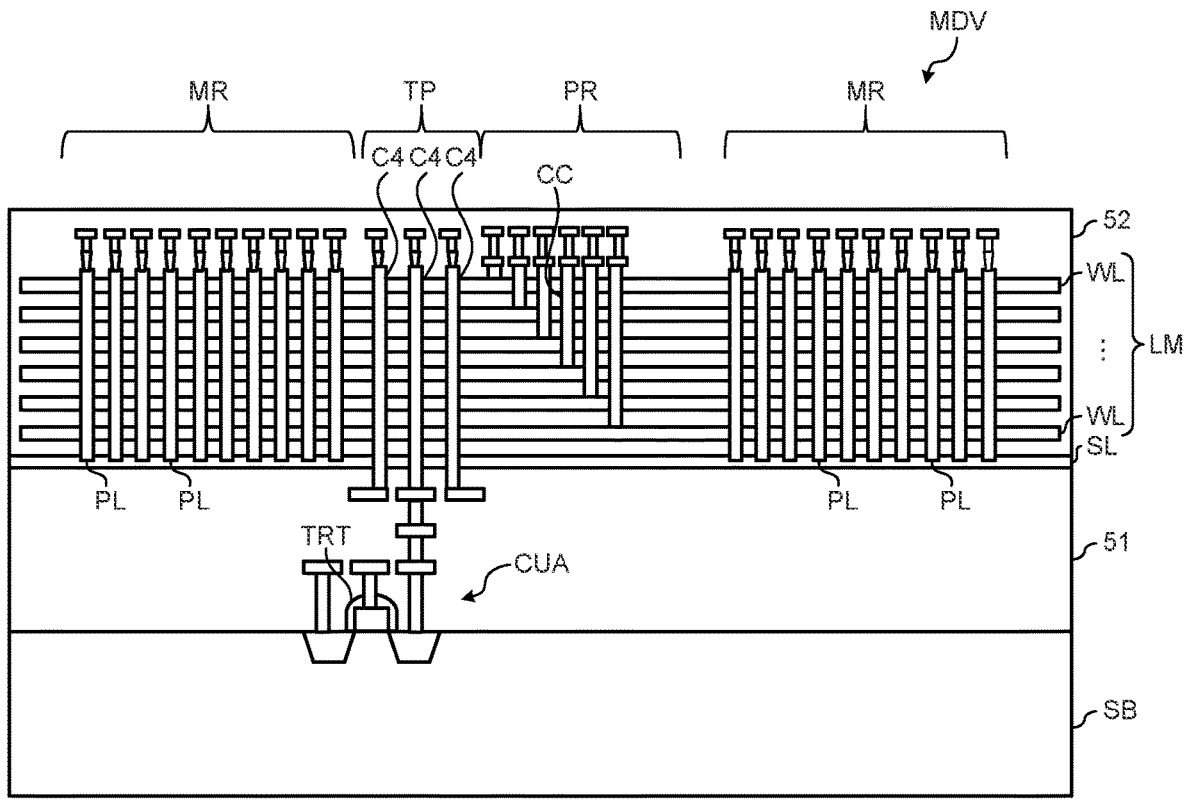
FIGS. 17A and 17B are cross-sectional views illustrating an exemplary configuration of the semiconductor device according to an embodiment.
Figure 17B:
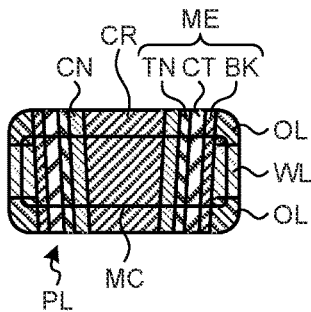

FIGS. 17A and 17B are cross-sectional views illustrating an exemplary configuration of a semiconductor device MDV according to an embodiment. FIG. 17A is a cross-sectional view illustrating a schematic configuration of the semiconductor device MDV according to an embodiment, and FIG. 17B is an enlarged cross-sectional view of a pillar PL included in the semiconductor device MDV. Moreover, in FIG. 17A, the hatching is omitted to improve the visibility of the drawing.

As illustrated in FIG. 17A, the semiconductor device MDV includes a peripheral circuit CUA, a source line SL, and a stacked body LM in this order on a substrate SB such as a silicon substrate. The peripheral circuit CUA includes a transistor TRT or the like formed on the substrate SB and makes for the electrical operations of a memory cell, which will be described later. The peripheral circuit CUA is covered with an insulating film 51, such as a silicon oxide film. The source line SL is a conductive polysilicon layer or the like and is formed on the insulating film 51.

The stacked body LM on the source line SL has a structure in which a plurality of word lines WL is arranged on top of each other. The word line WL is, for example, a tungsten layer or a molybdenum layer. The number of stacked word lines WL is, for example, approximately several tens to hundreds. Although not illustrated in FIG. 17A, an insulating layer OL (see FIG. 17B), such as a silicon oxide layer, is interposed between the plurality of word lines WL.

The stacked body LM includes a memory region MR, a contact region PR, and a through contact region TP, with each region being provided with a plurality of pillars PL and a plurality of contacts CC and C4. The stacked body LM is entirely covered with an insulating film 52, such as a silicon oxide film.

The plurality of pillars PL each penetrates the stacked body LM and reaches the source line SL. A detailed configuration of the pillar PL is illustrated in FIG. 17B.

As illustrated in FIG. 17B, the pillar PL includes a memory layer ME and a channel layer CN in this order from the outer periphery of the pillar PL. A core layer CR is filled further inside the channel layer CN. The memory layer ME has a multi-layer structure in which a block insulating layer BK, a charge accumulation layer CT, and a tunnel insulating layer TN are stacked in this order from the outer periphery of the pillar PL. Moreover, the memory layer ME is not provided at the lower-end portion of the pillar PL, and the channel layer CN inside the pillar PL is connected to the source line SL.

The channel layer CN is a semiconductor layer such as a polysilicon or amorphous silicon layer. The core layer CR, the tunnel insulating layer TN, and the block insulating layer BK are, for example, silicon oxide layers. The charge accumulation layer CT is, for example, a silicon nitride layer.

Such a configuration allows a plurality of memory cells MC arranged in the height direction to be formed at the intersections of the pillars PL and the word lines WL. A predetermined voltage is applied from the word line WL to the memory cells MC at the same height position. This causes charges to be accumulated in the charge accumulation layers CT of the memory cells MC or causes charges to be extracted from the charge accumulation layers CT, enabling data to be written and read from the memory cells MC. The data read from the memory cell MC is transmitted to a sense amplifier (not illustrated) through a plug above the pillar PL, an upper layer wiring, or the like.

The plurality of contacts CC each reaches the depth position of one of the plurality of word lines WL included in the stacked body LM and is connected to the reached word line WL. In addition, the multiple respective contacts CC are connected to a plurality of contacts C4 via the upper layer wiring and the plugs.

The plurality of contacts C4 passes through the stacked body LM and the source line SL, reaching the insulating film 51 below the stacked body LM. In the insulating film 51, the lower-end portion of each of the contacts C4 is connected to the transistor TRT of the peripheral circuit CUA through the lower layer wirings, vias, contacts, and the like.

Such a configuration makes it possible to apply a predetermined voltage from the peripheral circuit CUA to the respective memory cells MC through the contacts C4 and CC to enable the electrical operation of the memory cells MC.

The semiconductor device MDV having the configuration described above makes it possible for the plurality of contacts CC reaching the word lines WL at different depths of the stacked body LM to be formed using, for example, the template TM described above.

As described above, the multiple columnar patterns CL of the template TM are transferred to the resist film formed on the stacked body LM, and the stacked body LM is processed through the resist film, forming the plurality of contact holes having different reaching depths in the stacked body LM, like the holes CHa to CHk described above. Moreover, in this stage, the stacked body LM can have a structure in which a plurality of silicon oxide layers and silicon nitride layers are stacked, for example, like the processing-target film PF described above.

Then, the replacement processing is performed to replace the silicon nitride layer of the stacked body LM with the word line WL, such as a tungsten layer. In addition, the sidewalls of the plurality of contact holes formed using the template TM are covered with an insulating layer, and the inside of the insulating layer is filled with a conductive layer. Such processing allows the plurality of contacts CC to be formed to be respectively connected to the plurality of word lines WL having different depths in the stacked body LM.

As described above, the contact holes formed in the stacked body LM by performing the imprinting processing using the template TM have, for example, rounded corners. Thus, embedding a conductive layer in the contact hole to function as the contact CC makes it possible to prevent or reduce the power or the like from concentrating in the acute-angled portion of the contact CC.

(Inspection Method by Inspection Apparatus)

Figure 18:
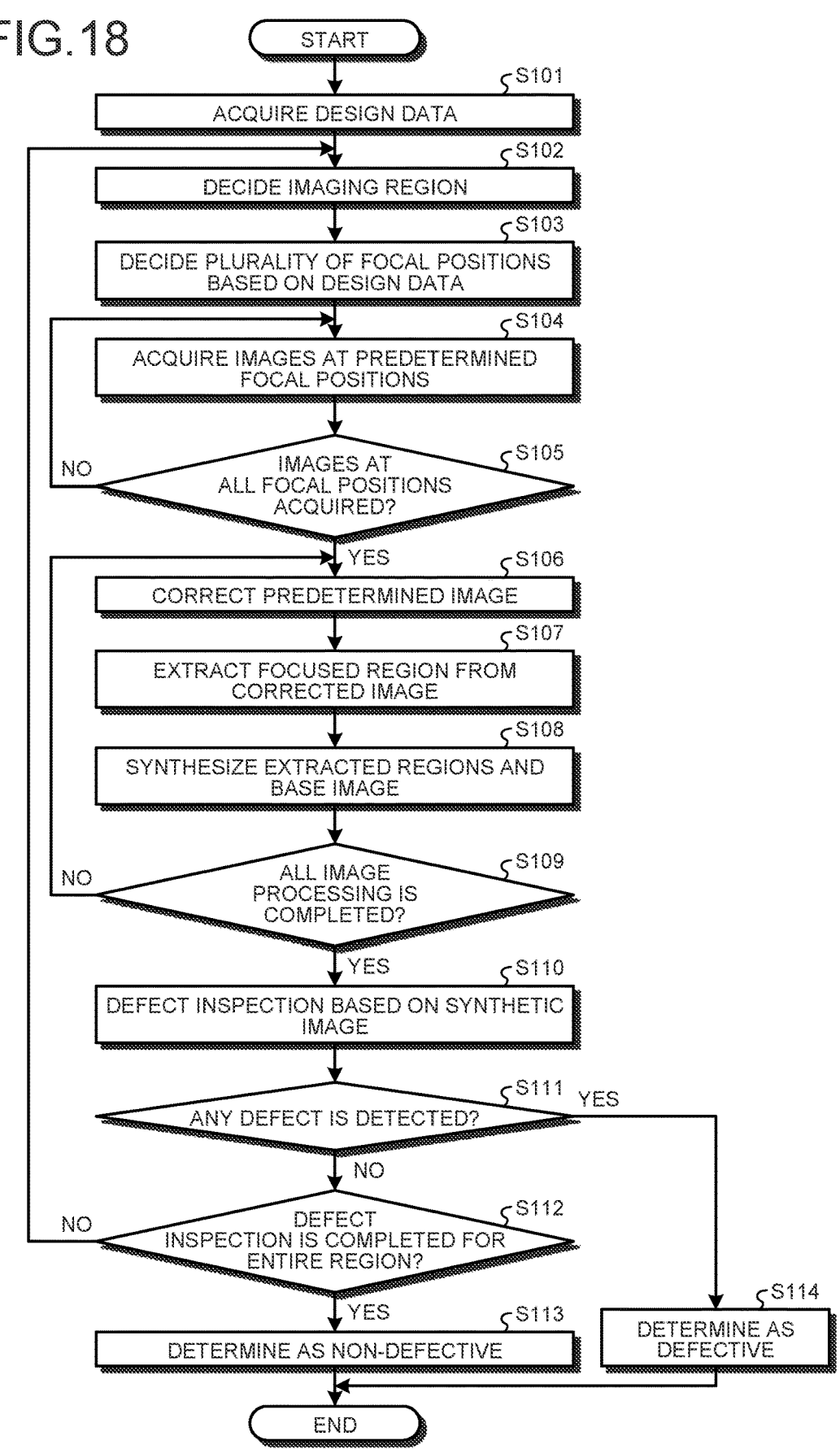
FIG. 18 is a flowchart illustrating an exemplary process of a method of inspection performed by the inspection apparatus according to an embodiment.

An example of a method of inspecting a defect by the inspection apparatus 1 according to an embodiment is now described with reference to FIG. 18. FIG. 18 is a flowchart illustrating an exemplary process of a method of inspection performed by the inspection apparatus 1 according to an embodiment. The inspection method according to an embodiment is performed, for example, as part of manufacturing the template TM, the master template TMm, or the semiconductor device MDV. The case where the object to be inspected is the template TM is herein described as an example.

As illustrated in FIG. 18, the design data acquisition unit 205 of the overall controller 20 that controls the inspection apparatus 1 acquires the design data for the template TM from the design device 50 (Step S101).

The focus decision unit 206 decides a predetermined region that fits within one frame of the imaging unit 11 as an imaging region from the entire inspection-target region of the template TM on the basis of the design data (Step S102). In addition, the focus decision unit 206 decides a plurality of focal positions necessary to focus on each of the multiple columnar patterns CL of the template TM within the decided imaging region on the basis of the height information of the acquired design data (Step S103). This allows a plurality of target values regarding the relative position between the template TM and the objective lens 14*j* to be obtained.

The inspection unit 201 controls the imaging unit 11 through the imaging controller 21 so that the imaging unit 11 captures an image at a predetermined focal position among the focal positions based on the plurality of decided target values. In other words, the inspection unit 201 adjusts the relative position between the template TM and the objective lens 14*j* to a predetermined focal position on the basis of a predetermined target value, allowing an image at the adjusted position to be captured. The image management unit 202 stores the image captured by the imaging unit 11 in the storage device 31 (Step S104).

The inspection unit 201 determines whether the acquisition of the plurality of images focused at each of the plurality of focal positions is completed or not (Step S105). If there is a focal position where an image fails to be acquired (Step S105: No), then the inspection unit 201 and the image management unit 202 repeat the processing from Step S104 onward for the focal position where an image fails to be acquired.

If the images are acquired at all focal positions (Step S105: Yes), then the image synthesis unit 207 corrects a predetermined image of a plurality of images other than the image to be the reference image (Step S106). In addition, the image synthesis unit 207 specifies and extracts a region that includes the focused columnar pattern CL in the image subjected to the correction processing on the basis of the arrangement information of the design data (Step S107). In addition, the image synthesis unit 207 applies the extracted region to the corresponding region of the reference image, synthesizing the extracted regions (Step S108).

The image synthesis unit 207 determines whether the synthesis processing is completed or not for all the plurality of images other than the image to be the reference image (Step S109). If an image that fails to be synthesized remains (Step S109: No), then the image synthesis unit 207 repeats the processing from Step S106 onward for the image that fails to be synthesized.

If the synthesis processing for all the images is completed (Step S109: Yes), then the defect determination unit 208 performs the defect inspection on the basis of the synthetic image obtained by synthesizing all the images (Step S110). In addition, the defect determination unit 208 determines whether any defect is detected or not in the inspected synthetic image (Step S111). If a defect is detected (Step S111: Yes), then the defect determination unit 208 determines that the template TM is defective (Step S114) and terminates the defect inspection processing.

If no defect is detected (Step S111: Yes), then the defect determination unit 208 determines whether the defect inspection is completed or not for the entire inspection-target region of the template TM (Step S112). If there is an uninspected region (Step S112: No), then the overall controller 20 repeats the processing from Step S102 onward for the uninspected region.

If the defect inspection for all inspection-target regions is completed without detecting any defects (Step S112: Yes), then the defect determination unit 208 determines that the template TM is non-defective (Step S113).

Thus, the defect inspection by the inspection apparatus 1 according to an embodiment is terminated.

Moreover, the procedure illustrated in the flowchart of FIG. 18 is merely an example, and the defect inspection can be performed using a procedure different from the procedure described above.

In one example, synthesizing regions extracted from a plurality of images into the reference image can be performed collectively without being limited to the example of FIG. 18. In other words, after extracting the in-focus region individually from all the images, the synthesis processing in Step S108 can be performed after the processing in Step S109. In addition, for example, even after a defect is detected in one imaging region, the defect inspection can continue until the inspection of all the regions is completed.

Further, the defect inspection method performed by the inspection apparatus 1 can include processing of correcting the defect by reworking the template TM in which the defect is detected.

Overview

In the manufacturing process of a semiconductor device, a plurality of configurations having different arrival positions in the stacking direction of the semiconductor device may be formed. In the photolithography technique, it is difficult to collectively form a plurality of patterns having different focal depths. Therefore, a plurality of processes may be performed to form a plurality of configurations having different arrival positions in the stacking direction.

In such a case, if the imprinting processing is performed using a template having a plurality of patterns having different heights, a plurality of patterns having different height positions can be collectively formed on the resist film, and man-hours and costs can be reduced. On the other hand, defect inspection of a plurality of patterns formed on a template has the following problems.

In the imprinting processing, since the pattern of the template is transferred at the same magnification, the difference in height between the plurality of patterns tends to be large. For example, in the optical inspection apparatus, it is possible to focus only within a range of, for example, about 50 nm to 200 nm in the height direction in one-time image-capturing. Therefore, it is difficult to focus on all of the different height positions of the plurality of patterns included in one frame. If a pattern that is not in focus is included in the same image, for example, in Cell-to-Cell inspection for comparing a plurality of patterns in one image, the accuracy of defect detection decreases.

Here, for example, a confocal microscope can generate an all-in-focus image focused on each of the plurality of patterns having different heights. In the confocal microscope, two-dimensional scanning with a laser is performed in a planar direction of a sample to acquire a tomographic image of a minute region focused on each layer. Thereafter, by combining these tomographic images, an all-in-focus image focused at all height positions is obtained.

However, in the confocal microscope, a large-scale mechanism such as a two-dimensional scanning laser is required, and the inspection cost increases. In addition, it is necessary to two-dimensionally scan the sample from various directions, and calculation based on enormous data is required, and for example, it takes a long time to generate an all-in-focus image.

According to the inspection apparatus 1 of an embodiment, a plurality of focused images IM1 to IM8, which are images obtained by capturing the multiple columnar patterns CLa to CLp from the height direction, is captured at each of a plurality of focal positions, and a region including the focused columnar pattern CL among the multiple columnar patterns CLa to CLp is extracted from each of the plurality of images IM1 to IM8 to generate a synthetic image.

By synthesizing the images IM1 to IM8 in this manner, it is possible to generate a highly sensitive synthetic image. In addition, by inspecting the defects of the multiple columnar patterns CLa to CLp from such a synthetic image, the defect inspection of the multiple columnar patterns CLa to CLp having different heights can be performed with high accuracy.

According to the inspection apparatus 1 of an embodiment, the image IM0 focused at the height position of the reference plane RP of the template TM is captured by the imaging unit 11, and the region extracted from the plurality of images IM1 to IM8 is arranged in the corresponding region of the image IM0 to generate the synthetic image.

In this manner, by applying the regions extracted from the plurality of images IM1 to IM0 using the image IM0 capable of specifying the arrangement positions of the multiple columnar patterns CLa to CLp as a base, the columnar patterns CLa to CLp can be arranged at more accurate positions, and a synthetic image can be easily generated.

According to the inspection apparatus 1 of an embodiment, the plurality of focal positions is determined based on the height information regarding the height of each of the multiple columnar patterns CL from the reference plane RP included in the design data.

In this manner, by referring to the design data, it is possible to easily specify the heights of the multiple columnar patterns CL from the reference plane RP without two-dimensionally scanning the template TM from various directions as in, for example, a confocal microscope, and to determine the plurality of focal positions according to the heights.

According to the inspection apparatus 1 of an embodiment, the focused region is extracted from the plurality of images IM1 to IM8 based on the arrangement information regarding the arrangement of the plurality of patterns CL on the reference plane RP included in the design data.

In this manner, by referring to the design data, it is possible to easily specify the arrangement position of the multiple columnar patterns CL in the reference plane RP without two-dimensionally scanning the template TM from various directions as in, for example, a confocal microscope, and to extract a focused region from the plurality of images IM1 to IM8.

According to the method of manufacturing the template TM of an embodiment, the multiple columnar patterns CL protruding at different heights from the reference plane RP is formed.

As a result, patterns having different reaching depths can be collectively formed in the resist film 83, and the semiconductor device MDV including the plurality of contacts CC connected to the plurality of word lines WL can be easily manufactured. Therefore, man-hours and costs at the time of manufacturing the semiconductor device MDV can be reduced.

According to the master template TMm and the method of manufacturing the semiconductor device MDV of an embodiment, the same effects as those of the method of manufacturing the template TM of the embodiment are obtained.

Modification

In the above-described embodiment, an example of performing defect inspection of the template TM including the multiple columnar patterns CL has been described. However, a template having a pattern different from the above-described template TM is also an inspection target of the inspection apparatus 1 of the embodiment.

Hereinafter, a template TMa of a modification that can be an inspection target of the inspection apparatus 1 of an embodiment will be described with reference to FIGS. 19A to 25B. In the following FIGS. 19A to 25B, the same reference numerals are given to the same configurations as those of the above-described embodiment, and the description thereof will be omitted.

FIGS. 19A to 19C are schematic diagrams illustrating an exemplary configuration of the template TMa according to a modification of an embodiment. FIG. 19A is a perspective view of the template TMa on a reference plane RP, and FIG. 19B is a top view of a stairs pattern PY included in the template TMa. FIG. 19C is a cross-sectional view illustrating the whole configuration of the template TMa.

As illustrated in FIG. 19C, the template TMa of a modification includes the plurality of stairs patterns PY having a stairs shape on a reference plane RP of the mesa portion MS protruding to the front surface side of the transparent substrate BA.

As illustrated in FIGS. 19A and 19B, the stairs pattern PY has, for example, a rectangular shape in top view, and a plurality of stairs shapes, that is, a plurality of steps SP, in which the height increases from the outer peripheral side to the central side of the stairs pattern PY, is formed on four sides of the stairs pattern PY.

The heights of these steps SP from the reference plane RP are different from each other. The difference of height in each step SP is, for example, about several nm to several tens nm. The number of steps SP from the lowermost step to the uppermost step of the stairs pattern PY is, for example, about several tens to hundreds.

Figure 20:
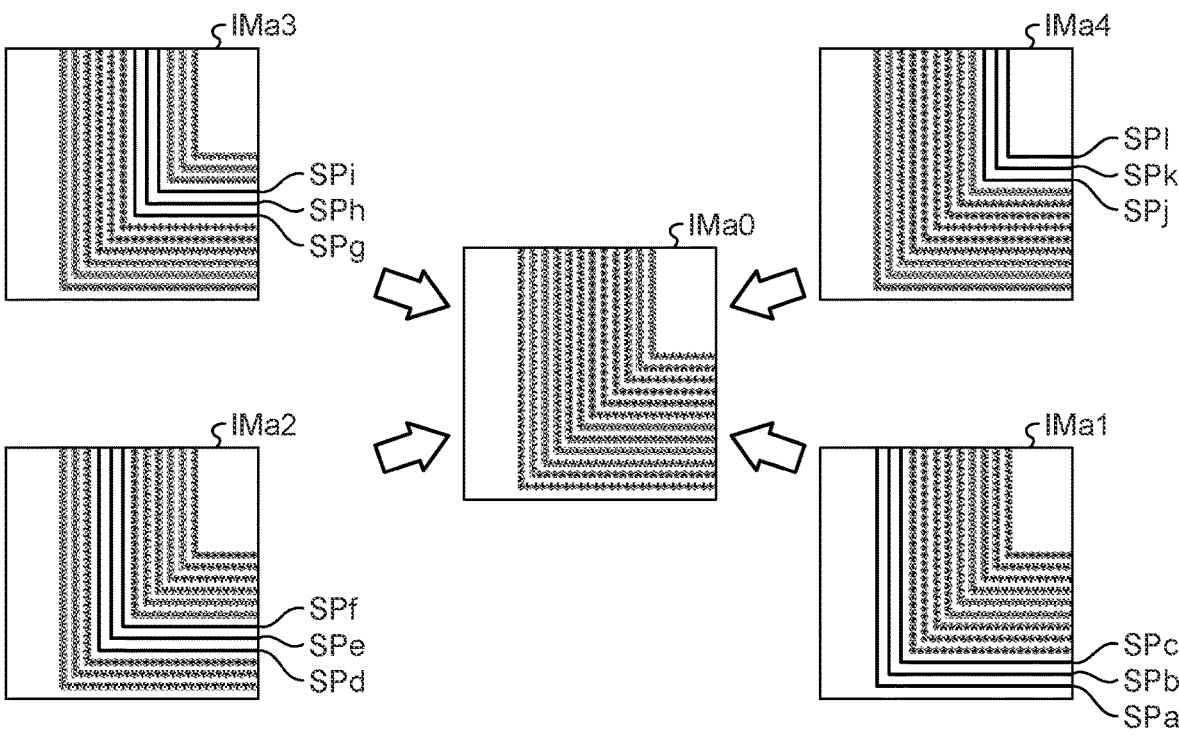
FIG. 20 is a diagram illustrated to describe how to inspect a template according to a modification of an embodiment by the inspection apparatus.

FIG. 20 illustrates an example in which the template TMa having such stairs pattern PY is inspected by the inspection apparatus 1 according to an embodiment. FIG. 20 is a diagram illustrated to describe how to inspect a template TMa according to a modification of an embodiment by the inspection apparatus 1.

As illustrated in FIG. 20, in a case where the stairs pattern PY included in the template TMa is captured, it is assumed that the plurality of steps SPa to SP1 fits within a range captured per one time, that is, a frame of the imaging unit 11. In addition, it is assumed that it is not possible to focus on all of the plurality of steps SPa to SP1 in one-time image-capturing.

Similar to the embodiment describe above, the design data acquisition unit 205 of the overall controller 20 that controls the inspection apparatus 1 acquires the design data for the template TMa from the design device 50. The focus decision unit 206 decides a plurality of target values necessary to focus on each of the plurality of steps SP of the template TMa with respect to the relative position between the template TM and the objective lens 14j on the basis of the height information of the design data.

The inspection unit 201 of the overall controller 20 controls the imaging unit 11 through the imaging controller 21 to focus on each of the relative positions between the template TM and the objective lens 14j based on the plurality of determined target values and capture the plurality of images IMa0 to IMa4 including the plurality of steps SPa to SP1.

The image IMa0 is an image to be a reference image focused on the vicinity of the height position of the reference plane RP of the template TMa. The image IMa1 is captured by focusing on the vicinity of the height positions of the steps SPa to SPc among the plurality of steps SPa to SP1. In addition, the images IMa2 to IMa4 are captured by focusing on the vicinity of the height positions of steps SPd to SPf, SPg to SPi, and SPj to SP1, respectively.

After performing necessary correction on the images IMa1 to IMa4, the image synthesis unit 207 of the overall controller 20 extracts regions including steps SPa to SPc, SPd to SPf, SPg to SPi, and SPj to SP1 from the images IMa1 to IMa4, respectively, and applies the regions to the corresponding regions of the image IMa0. As a result, a synthetic image focused on all of steps SPa to SP1 is generated.

The defect determination unit 208 of the overall controller 20 performs the defect inspection in the plurality of steps SPa to SP1 on the basis of the generated synthetic image.

Next, a method of manufacturing the template TMa to be inspected by the inspection apparatus 1 will be described with reference to FIGS. 21A to 21D. FIGS. 21A to 21D are cross-sectional views illustrating part of the process of the method of manufacturing the template TMa according to a modification of an embodiment.

Figures 21A, 21B, 21C, 21D:
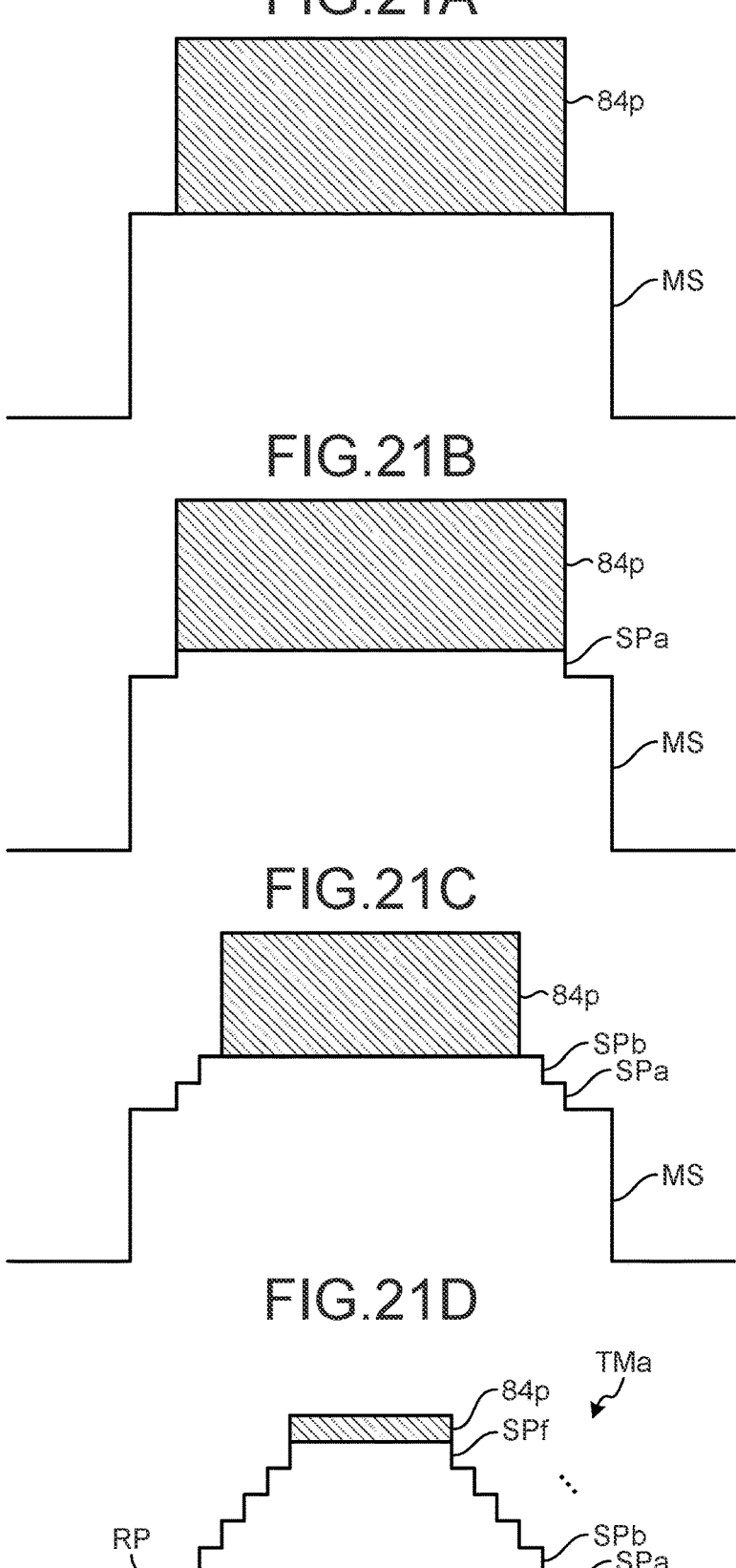
FIGS. 21A to 21D are cross-sectional views illustrating part of the process of the method of manufacturing the template according to a modification of an embodiment.

As illustrated in FIG. 21A, the mesa portion MS protruding from the surface of the transparent substrate BA (see FIG. 19C) of the template TMa is formed, and a resist pattern 84p is formed by exposing an outer edge portion of the mesa portion MS on the upper surface of the mesa portion MS. In this event, the upper surface of the transparent substrate BA, other than the mesa portion MS, can be covered with a mask film such as a chromium film (not illustrated).

As illustrated in FIG. 21B, the upper surface of the mesa portion MS exposed from the resist pattern 84p is processed. As a result, a step SPa is formed on the outer periphery of the mesa portion MS.

As illustrated in FIG. 21C, the resist pattern 84p is slimmed by oxygen plasma or the like, and the end portion of the resist pattern 84p on the mesa portion MS is receded. As a result, the outer peripheral portion of the mesa portion MS is newly exposed.

In addition, the upper surface of the mesa portion MS newly exposed from the resist pattern 84p is processed to form a step SPb on the outer periphery of the mesa portion MS. At this time, the upper surface of the already formed step SPa is removed and positioned below the step SPb.

As illustrated in FIG. 21D, slimming of the resist pattern 84p and processing of the mesa portion MS are repeated to form a plurality of steps SPa to SPf in which the position decreases stepwise from the upper surface of the mesa portion MS. In addition, in this event, the surface of the mesa portion MS exposed below the lowermost step SPf corresponds to the reference plane RP described above. Then, the remaining resist pattern 84p is removed.

Then, the multiple completed steps SP are subjected to the defect inspection by the inspection apparatus 1 of an embodiment using the inspection technique illustrated in FIG. 20 described above. When a defect is detected in any of the plurality of steps SP in the defect inspection, the template TMa is determined to be defective. In a case where no defect is detected during the defect inspection, the template TMa is determined as a non-defective product and is used for manufacturing a semiconductor device, which will be described later.

The template TMa according to a modification is manufactured by the processing operations described above.

Moreover, the method of manufacturing the template TMa described above is merely an example, and the template TMa according to a modification can be manufactured using techniques or methods other than those described above. For example, as in the above-described embodiment, the template TMa may be manufactured using the master template. Alternatively, for example, the plurality of steps SP can be drawn directly on the upper surface of the mesa portion MS of the transparent substrate BA using electron beams or the like.

Exemplary usages of the template TMa according to a modification are now described with reference to FIGS. 22A to 24C. The template TMa is also used, for example, in performing imprinting processing in the manufacturing process of a semiconductor device. The processing of FIGS. 22A to 24C described below, is performed, for example, as part of the method of manufacturing a semiconductor device.

FIGS. 22A to 24C are cross-sectional views sequentially illustrating part of the imprint processing using the template TMa according to a modification of an embodiment.

Figure 22A:
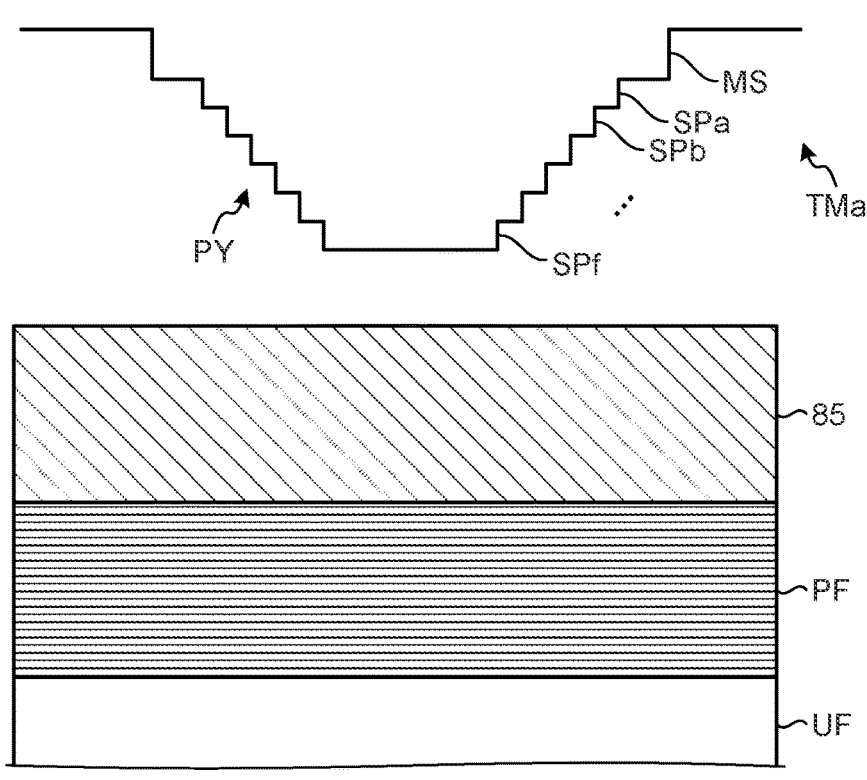
FIGS. 22A and 22B are cross-sectional views sequentially illustrating part of the imprint processing using a template according to a modification of an embodiment.

As illustrated in FIG. 22A, a processing-target film PF is formed on the underlying film UF, and a resist film 85 is formed on the processing-target film PF.

The underlying film UF is, for example, a part of the silicon substrate, an insulating film on the silicon substrate, or the like, similarly to the case of FIG. 14A described above. The processing-target film PF is, for example, a multilayer film in which a plurality of types of insulating layers are alternately laminated, similarly to the case of FIG. 14A described above.

The resist film 85 is, for example, a photocurable resin before being cured or the like formed by applying or dropping a resist material, which is similar to the resist film 83 in FIG. 14A described above.

The template TMa is made to be opposed to the resist film 85 with the surface on which the stairs patterns PY are formed facing the processing-target film PF to transfer the stairs pattern PY of the template TMa to the resist film 85.

Figure 22B:
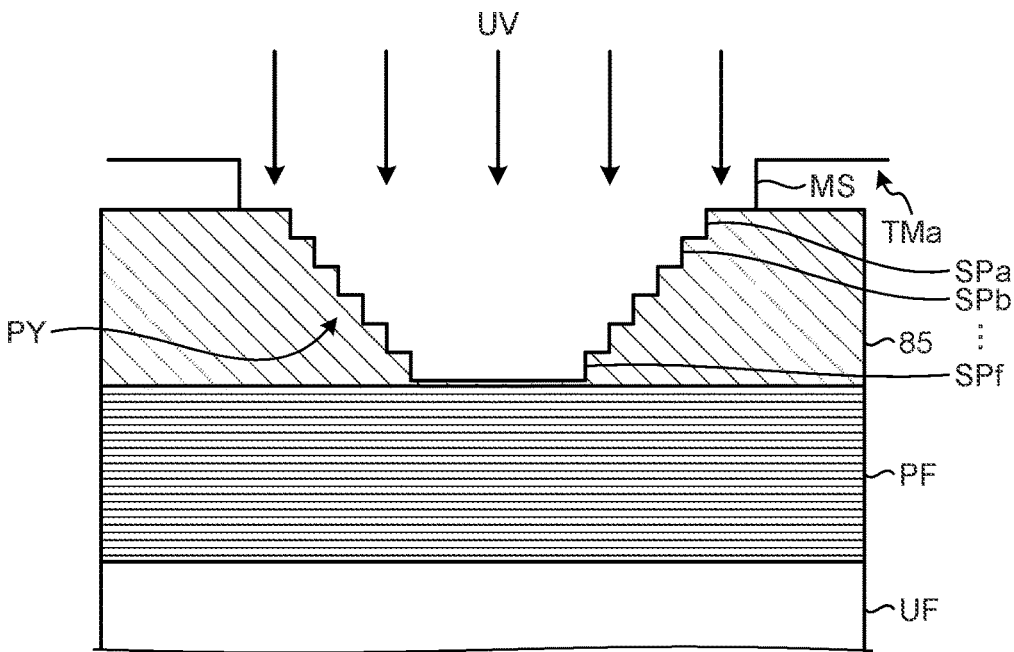

As illustrated in FIG. 22B, the stairs pattern PY of the template TMa is pressed against the resist film 85. In this event, a gap of such a degree that the mesa portion MS of the template TMa does not come into contact with the processing-target film PF is provided between the upper surface of the step SPf having the largest protrusion area and the processing-target film PF.

In this state, the resist film 85 is irradiated with light such as ultraviolet light transmitted through the template TMa while pressing the template TMa against the resist film 85, curing the resist film 85.

Figure 23A:
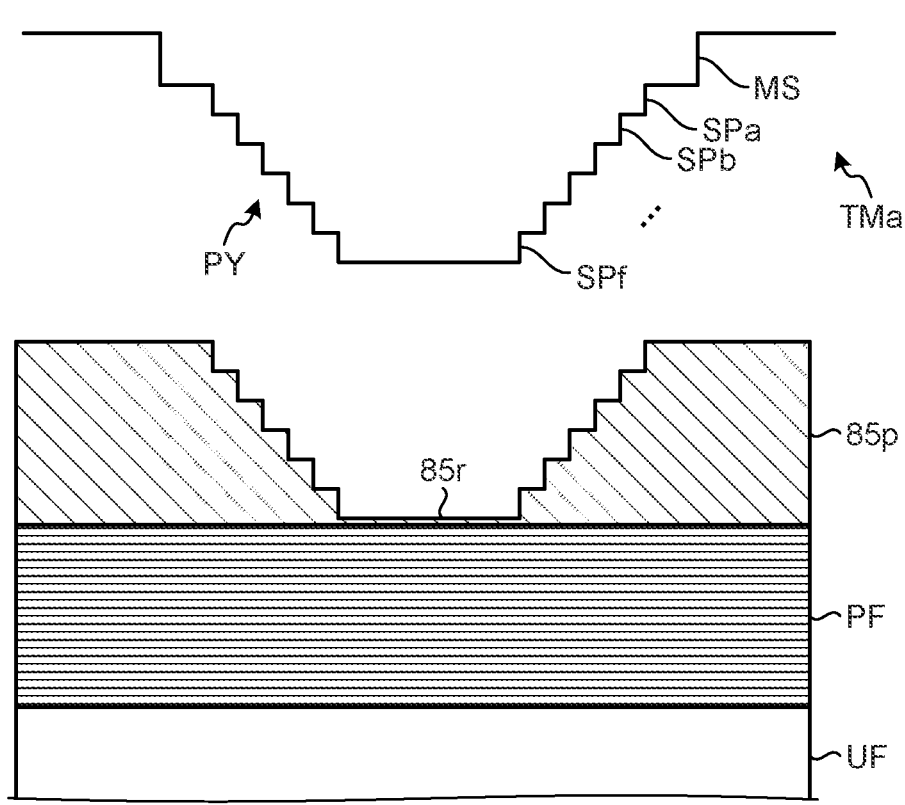
FIGS. 23A and 23B are cross-sectional views sequentially illustrating part of the imprint processing using a template according to a modification of an embodiment.

As illustrated in FIG. 23A, the template TMa is released from a mold, forming a resist pattern 85*p* to which the stairs pattern PY of the template TMa is transferred. As described above, the resist film 85 is cured with the gap being provided between the template TMa and the processing-target film PF, so the resist pattern 85*p* has a residual resist film 85*r* formed at the bottom of the transferred stairs pattern.

Thus, unlike the case of using the photolithography technique, the technique using the template TMa allows stairs patterns with different reaching depths in the resist film 85 to be formed in the resist film 85 by one time of the imprinting processing.

Figure 23B:
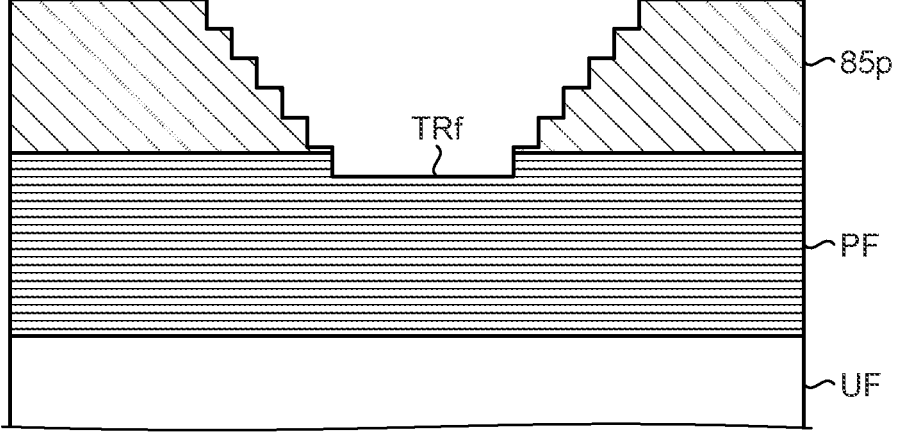

As illustrated in FIG. 23B, the residual resist film 85*r* on the bottom of stairs pattern is removed using oxygen plasma or the like. Such processing allows the upper surface of the processing-target film PF to be exposed at the bottom of the pattern.

Further, the processing on the processing-target film PF through the resist pattern 85*p* allows the processing-target film PF exposed from the resist pattern 85*p* to be removed, forming a terrace TRf to which the resist pattern 85*p* is transferred. In addition, the film thickness of the resist pattern 85*p* reduces, and the lowermost pattern disappears. As a result, the processing-target film PF is newly exposed on the outer peripheral portion of the terrace TRf.

Figure 24A:
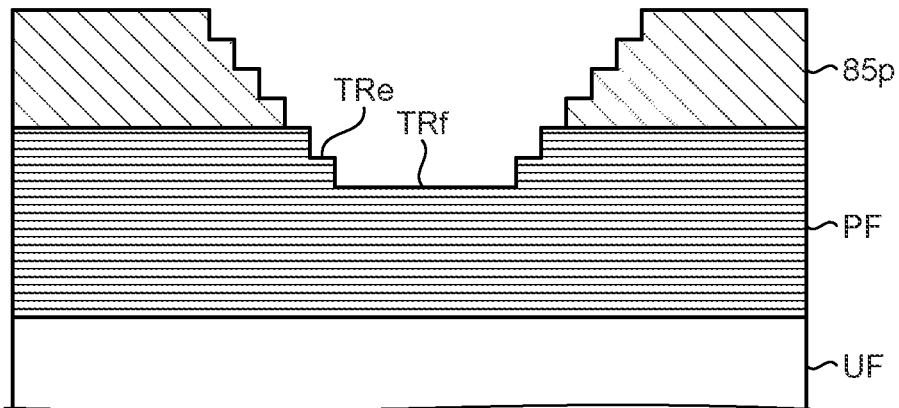
FIGS. 24A to 24C are cross-sectional views sequentially illustrating part of the imprint processing using a template according to a modification of an embodiment.

As illustrated in FIG. 24A, the processing on the processing-target film PF through the resist pattern 85*p* is further continued. Such processing allows the upper surface of the processing-target film PF exposed newly from resist pattern 85*p* to be removed to form a terrace TRe. The reaching depth of the terrace TRf in the processing-target film PF further increases. In addition, the film thickness of the resist pattern 85*p* reduces, the pattern on the second step from the lowermost step disappears, and the processing-target film PF is newly exposed on the outer peripheral portion of the terrace TRe.

Figure 24B:
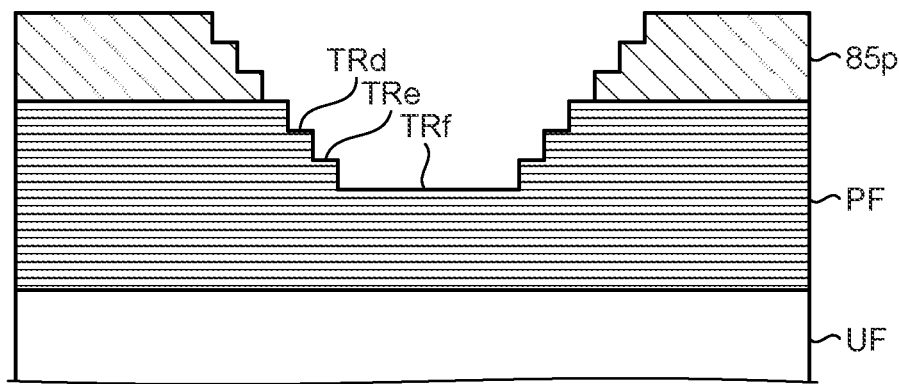

As illustrated in FIG. 24B, the processing on the processing-target film PF through the resist pattern 85*p* is further continued. As a result, the stairs portion of the resist pattern 85*p* sequentially disappears from the inside to the outside of the pattern, a new terrace TR is formed on the processing-target film PF, and the depth of each terrace TR increases.

Figure 24C:
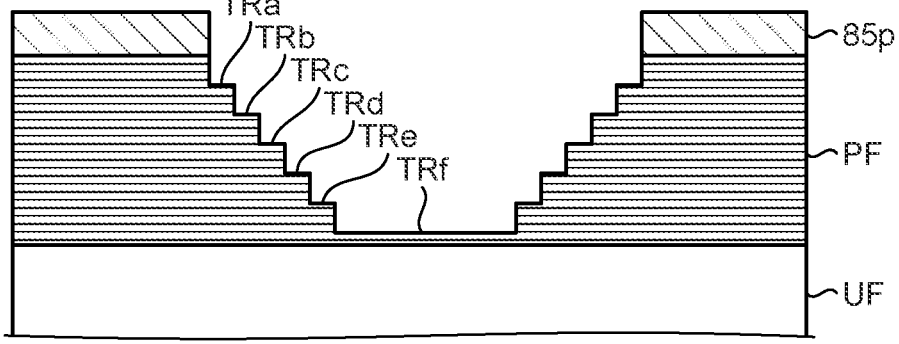

As illustrated in FIG. 24C, as the processing of the processing-target film PF via the resist pattern 85*p* is further continued, a plurality of terraces TRa to TRf whose depths increase stepwise are formed on the processing-target film PF. Then, the remaining resist pattern 85*p* is removed.

Thus, the imprinting processing using the template TMa is terminated.

An application example of the above-described terraces TR formed using the template TMa according to a modification applied to a semiconductor device is now described with reference to FIGS. 25A and 25B.

Figure 25A:
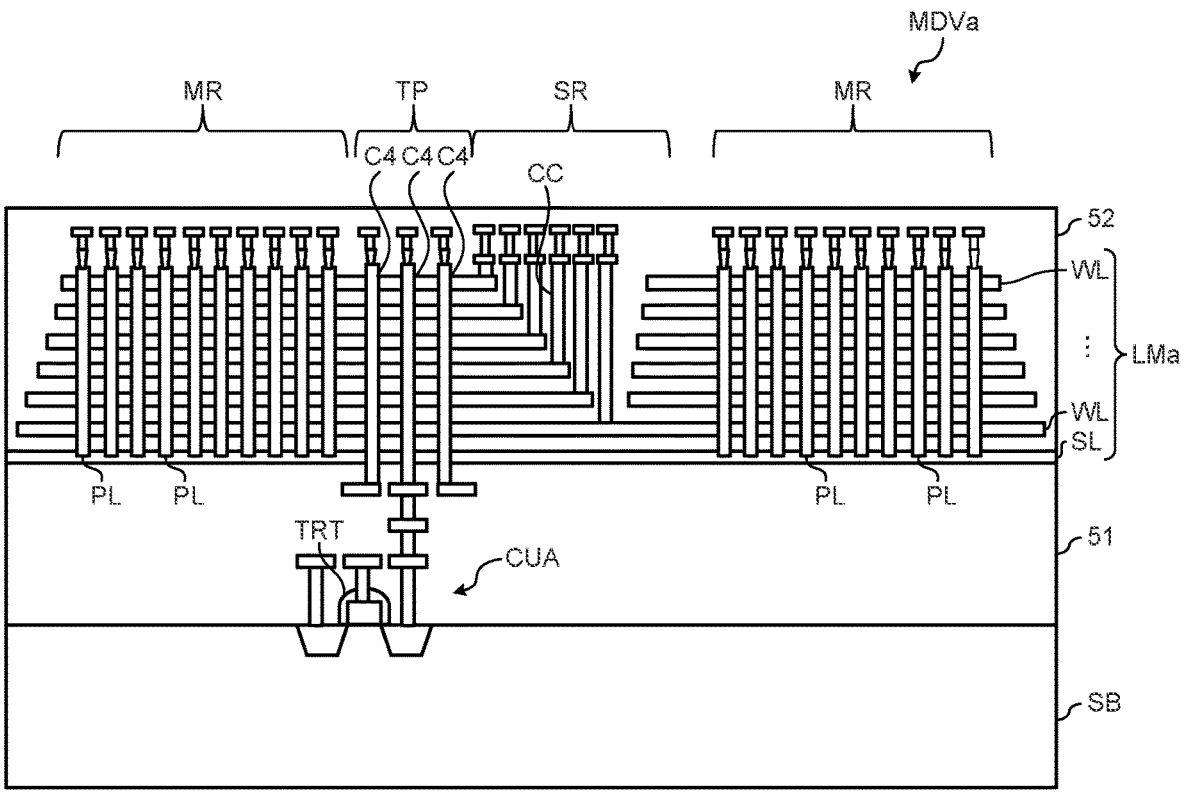
FIGS. 25A and 25B are cross-sectional views illustrating an exemplary configuration of a semiconductor device according to a modification of an embodiment.
Figure 25B:
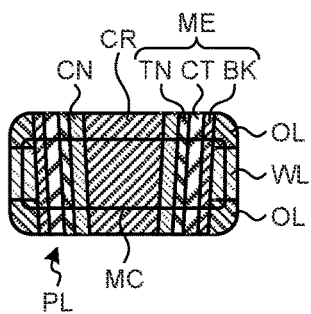

FIGS. 25A and 25B are cross-sectional views illustrating an exemplary configuration of a semiconductor device MDVa according to a modification of an embodiment. FIG. 25A is a cross-sectional view illustrating a schematic configuration of the semiconductor device MDVa according to a modification, and FIG. 25B is an enlarged cross-sectional view of a pillar PL included in the semiconductor device MDVa. Moreover, in FIG. 25A, the hatching is omitted to improve the visibility of the drawing.

As illustrated in FIG. 25A, the semiconductor device MDVa includes a stacked body LMa in which a plurality of word lines WL are stacked on the source line SL. Although not illustrated in FIG. 25A, an insulating layer OL (see FIG. 25B) is interposed between the plurality of word lines WL.

The stacked body LMa includes a stairs region SR instead of the contact region PR of the stacked body LM of the above-described embodiment, and a plurality of contacts CC is provided in the stairs region SR.

In the stairs region SR, the plurality of word lines WL and the plurality of insulating layers OL of the stacked body LMa are processed in a stairs shape, and have a rectangular mortar shape in top view. In one side of the mortar shape, the contact CC is connected on each terrace of the word line WL processed in a stairs shape.

Since the configuration of the pillar PL and the configuration of the memory cell MC formed in the pillar PL are similar to those of the semiconductor device MDV of the above-described embodiment, the description of FIG. 25B is omitted.

The semiconductor device MDVa having the above-described configuration makes it possible for the stairs shape in the stairs region SR of the stacked body LMa to be formed using, for example, the above-described template TMa.

As described above, the stairs pattern PY of the template TMa is transferred to the resist film formed on the stacked body LMa, and the stacked body LMa is processed through the resist film, so that a terrace is formed in each of the plurality of word lines WL having different depths in the stacked body LMa, like the terraces TRa to TRf described above.

Moreover, in this stage, similarly to the semiconductor device MDV of the above-described embodiment, the stacked body LMa can have a structure in which a plurality of silicon oxide layers and silicon nitride layers are stacked, for example, like the processing-target film PF described above. In this case, more precisely, a terrace is formed in each of the plurality of silicon nitride layers to be replaced by the above-described imprinting processing.

Thereafter, replacement processing of replacing the silicon nitride layer of the stacked body LMa with the word line WL such as a tungsten layer is performed, and a plurality of contacts CC connected to terraces of the plurality of word lines WL formed by the replacement is formed.

According to the method of manufacturing the template TMa of a modification, by applying the defect inspection using the inspection apparatus 1 of the above-described embodiment, the same effect as that of the above-described embodiment is obtained.

According to the method of manufacturing the template TMa of a modification, the plurality of stairs patterns PY having a stairs shape and protruding from the reference plane RP is formed.

As a result, patterns having different reaching depths can be collectively formed in the resist film 85, and the semiconductor device MDVa in which the plurality of word lines WL are processed in stepwise manner can be easily manufactured. Therefore, man-hours and costs at the time of manufacturing the semiconductor device MDVa can be reduced.

Other Embodiments

In the above-described embodiments, the inspection apparatus 1 acquires the design data of the templates TM and TMa from the design device 50, generates a plurality of images based on the design data, and synthesizes the images to generate the synthetic image.

Figure 26:
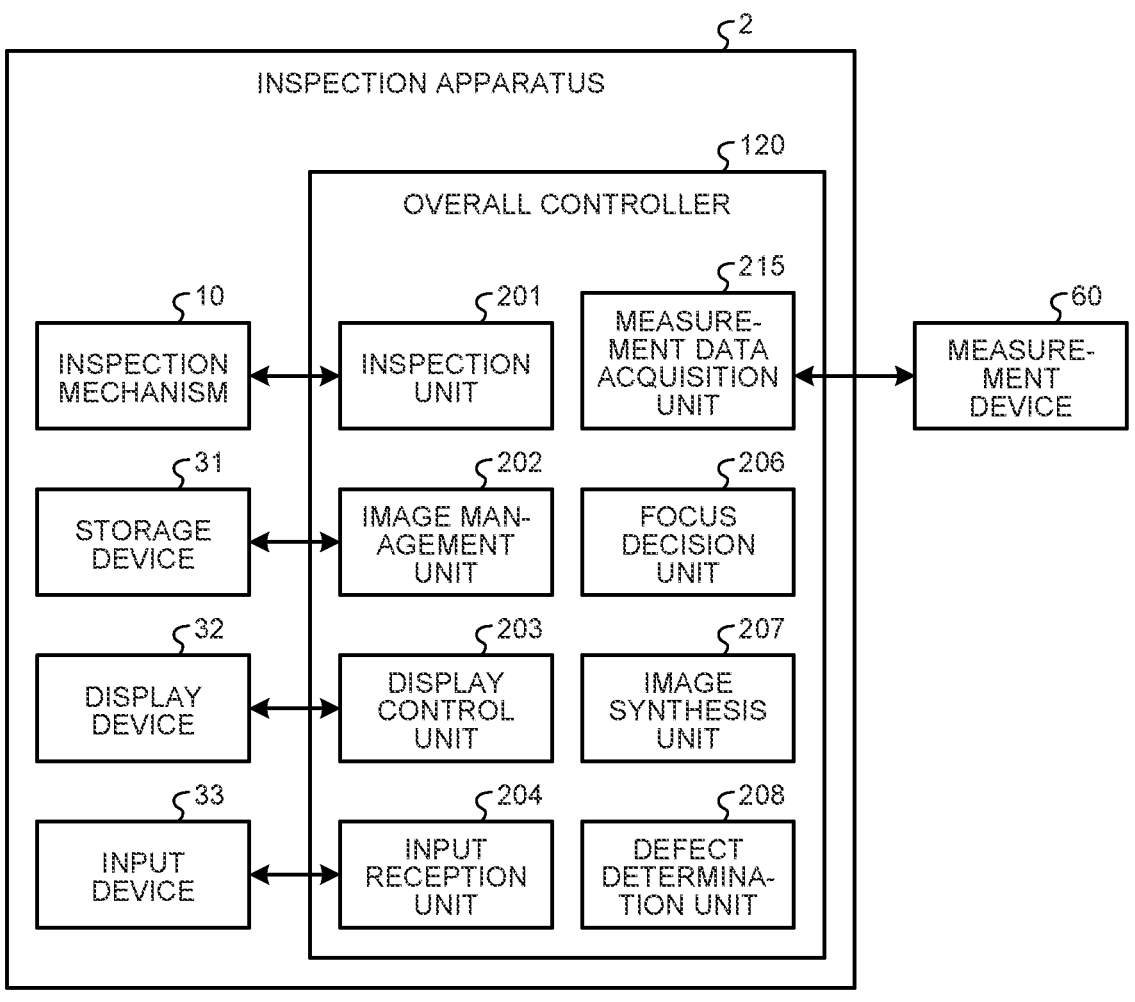
FIG. 26 is a block diagram illustrating an exemplary functional configuration of an overall controller of an inspection apparatus according to another embodiment together with other components of the inspection apparatus.
Figure 27:
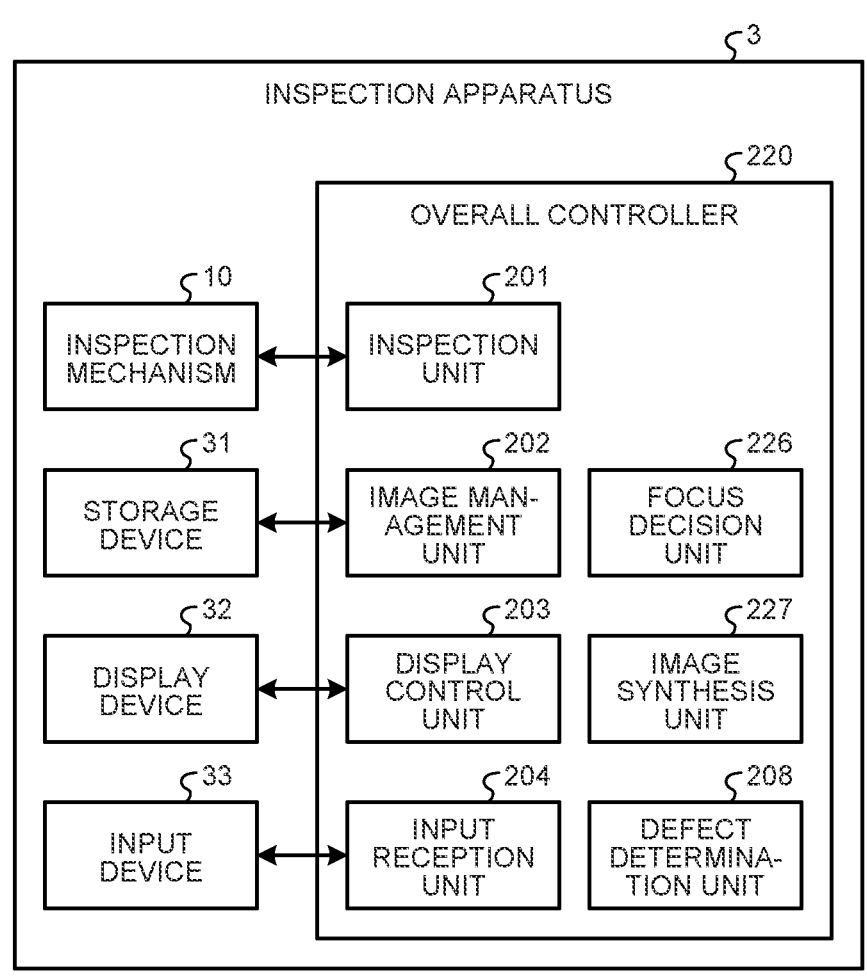
FIG. 27 is a block diagram illustrating another example of the functional configuration of the overall controller of the inspection apparatus according to another embodiment together with other components of the inspection apparatus.

However, the inspection apparatus may perform the defect inspection by a method other than the above. FIGS. 26 and 27 illustrate configuration examples of the inspection apparatuses 2 and 3 that perform defect inspection without using design data. In the FIGS. 26 and 27, the same reference numerals are given to the same configurations as those of the above-described embodiment, and the description thereof will be omitted.

FIG. 26 is a block diagram illustrating an exemplary functional configuration of an overall controller 120 of an inspection apparatus 2 according to another embodiment together with other components of the inspection apparatus 2. The inspection apparatus 2 illustrated in FIG. 26 acquires measurement data of a template to be inspected instead of the design data, and performs defect inspection based on the measurement data.

As illustrated in FIG. 26, the overall controller 120 that controls the inspection apparatus 2 includes a measurement data acquisition unit 215 instead of the design data acquisition unit 205. The measurement data acquisition unit 215 acquires measurement data obtained by measuring a template to be inspected from the measurement device 60.

The measurement device 60 is an atomic force microscope (AFM) that measures a height of each of a plurality of patterns formed on a template from a reference plane, a length measurement SEM (CD-SEM: Critical Dimension-Scanning Electron Microscope) that measures an arrangement position of each of the plurality of patterns on the reference plane, or the like. The measurement device 60 holds measurement data including the height information and the arrangement information.

The focus decision unit 206 of the overall controller 120 decides a plurality of target values, similarly to the above-described embodiment, regarding the relative position between the template TM and the objective lens 14j on the basis of the height information of the plurality of patterns included in the design data. Based on the arrangement information of the plurality of patterns included in the measurement data, the image synthesis unit 207 extracts a focused region from the plurality of captured images and generates a synthetic image.

FIG. 27 is a block diagram illustrating another example of the functional configuration of the overall controller 220 of the inspection apparatus 3 according to another embodiment together with other components of the inspection apparatus 3. The inspection apparatus 3 illustrated in FIG. 27 performs defect inspection of the template without based on data such as design data.

As illustrated in FIG. 27, the overall controller 220 that controls the inspection apparatus 3 does not include the design data acquisition unit 205 or the measurement data acquisition unit 215 described above. Furthermore, the overall controller 220 includes a focus decision unit 226 and an image synthesis unit 227 instead of the focus decision unit 206 and the image synthesis unit 207 of the above-described embodiment.

The focus decision unit 226 determines a plurality of target values regarding the relative position between the template TM and the objective lens 14j within a range in which the inspection apparatus 3 can focus. At this time, the relative position between the template TM and the objective lens 14j based on the plurality of target values corresponds to a plurality of focal positions arranged at predetermined intervals in the height direction. Each focal position can take an interval corresponding to the focal depth of light used for inspection, for example. That is, when the focal depth of the inspection light is, for example, about 50 nm to 200 nm, the interval between the focal positions can be set to about 50 nm to 200 nm.

The plurality of focal positions are determined without being based on the height positions of the plurality of patterns included in the template. The focus decision unit 226 can determine the above target value on the basis of these focal positions, for example, so as to include a range from the lowest height position to the highest height position that can be focused in the inspection apparatus 3. This makes it possible to capture a plurality of images focused on the height positions of the plurality of patterns of the template.

The image synthesis unit 227 extracts a region including a focused pattern among the plurality of patterns from each of the plurality of images determined as described above. At this time, the image synthesis unit 227 specifies a pattern in focus using an image analysis technology. According to the image analysis, for example, a focused pattern can be specified on the basis of at least one of the lightness of each pattern, the lightness around the pattern, the amount of change in contrast of the boundary portion of the pattern, which is the difference between these lightness, the sharpness of the contour line of the pattern, and the like. The image synthesis unit 227 combines the regions extracted from the plurality of images to generate a synthetic image.

According to the inspection apparatuses 2 and 3 of the other embodiments, the same effects as those of the inspection apparatus 1 of the above-described embodiment are obtained.

In addition, in the above-described embodiment and the like, the inspection apparatus 1 to 3 performs defect inspection by capturing a figure formed from reflected light reflected on a sample such as the template TM or TMa. However, the inspection apparatus may include, for example, a transmitted illumination optical system or the like, and may perform defect inspection by capturing a figure formed from transmitted light transmitted through the sample.

In the above-described embodiment and the like, the inspection apparatus 1 to 3 is an optical inspection apparatus, but the inspection apparatus may be a charged particle beam inspection apparatus using charged particles such as an electron beam.

In addition, in the above-described embodiment and the like, the defect inspection for the templates TM and TMa has been described. However, the inspection apparatus can also perform defect inspection of another sample such as a semiconductor device having a plurality of patterns having different heights from the reference plane. Examples of the pattern included in such a semiconductor device include a plurality of holes CH illustrated in FIG. 16C, a plurality of terraces TR illustrated in FIG. 24C, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inspection apparatus that inspects for a defect in a sample having a region including a plurality of patterns with different heights from a reference plane in a first direction intersecting the reference plane, the inspection apparatus comprising:

an imaging unit that captures an image of the region;

a lens;

a focus decision unit that decides a plurality of target values regarding a relative distance in the first direction between the reference plane and the lens based on height information regarding the height, the plurality of target values being different from each other;

an image acquisition unit that adjusts the relative distance in the first direction between the reference plane and the lens based on the plurality of target values and causes the imaging unit to capture a plurality of images while fixing a relative position between the region and the lens in second and third directions that intersect each other along the reference plane, the plurality of images including a whole of the region from the first direction at respective relative distances in the first direction;

an image synthesis unit that extracts a first part including a first pattern from a first image including the first pattern and a second pattern from among the plurality of images, extracts a second part including the second pattern from a second image including the first pattern and the second pattern from among the plurality of images, and generates a synthetic image including the first part and the second part, the first pattern and the second pattern being included in the plurality of patterns, and the second pattern being different in height from the first pattern; and a defect determination unit that determines presence or absence of the defect in the sample from the synthetic image, wherein:

the first image is captured at the relative distance in the first direction adjusted based on a first target value among the plurality of target values, the second image is captured at the relative distance in the first direction adjusted based on a second target value among the plurality of target values, the second target value being different from the first target value, the first target value is decided based on first height information regarding the first pattern from among the height information, and the second target value is decided based on second height information regarding the second pattern from among the height information, the second height information showing a different height than a height shown by the first height information.

2. The inspection apparatus according to claim 1, wherein the image synthesis unit generates the synthetic image by arranging the first part and the second part at corresponding positions of a third image including the first pattern and the second pattern from among the plurality of images, the third image being different from the first image and the second image.

3. The inspection apparatus according to claim 1, further comprising:

a data acquisition unit that acquires the height information.

4. The inspection apparatus according to claim 3, wherein:

the data acquisition unit further acquires arrangement information regarding an arrangement of the plurality of patterns, and the image synthesis unit extracts the first part and the second part based on a basis of the arrangement information to generate the synthetic image.

5. The inspection apparatus according to claim 4, wherein the data acquisition unit acquires CAD data including the height information and the arrangement information.

6. A method of manufacturing a template having a region including a plurality of patterns with different heights from a reference plane in a first direction intersecting the reference plane, the method comprising:

forming the plurality of patterns on a transparent substrate;

deciding a plurality of target values regarding a relative distance in the first direction between the reference plane and a lens based on height information regarding the height, the plurality of target values being different from each other;

capturing a first image including a whole of the region from the first direction, with the relative distance in the first direction between the reference plane and the lens adjusted based on a first target value from among the plurality of target values;

capturing a second image including the whole of the region from the first direction, while fixing a relative position between the region and the lens in second and third directions to a capturing position of the first image, with the relative distance in the first direction between the reference plane and the lens adjusted based on a second target value from among the plurality of target values, the second target value being different from the first target value, and the second and third directions intersecting each other along the reference plane;

extracting a first part including a first pattern from the first image including the first pattern and a second pattern, the first pattern and the second pattern being included in the plurality of patterns;

extracting a second part including the second pattern from the second image including the first pattern and the second pattern, the second pattern being different in height from the first pattern;

generating a synthetic image including the first part and the second part;

determining presence or absence of a defect in the transparent substrate from the synthetic image;

deciding the first target value based on a first height information regarding the first pattern from among the height information in the deciding the plurality of target values; and deciding the second target value based on second height information regarding the second pattern from among the height information in the deciding the plurality of target values, the second height information showing a different height than a height shown by the first height information.

7. The method according to claim 6, further comprising:

capturing a third image including the whole of the region from the first direction, with the relative distance in the first direction between the reference plane and the lens adjusted based on a third target value from among the plurality of target values, wherein the synthetic image is generated by arranging the first part and the second part at corresponding positions of the third image including the first pattern and the second pattern in generating the synthetic image.

8. The method according to claim 7, further comprising:

acquiring arrangement information regarding an arrangement of the plurality of patterns, wherein the first part and the second part are specified and extracted respectively from the first image and the second image based on the arrangement information upon extracting the first part and the second part.

9. The method of manufacturing a template according to claim 8, wherein the height information and the arrangement information are included in CAD data.

10. A method of inspecting a template having a region including a plurality of patterns with different heights from a reference plane in a first direction intersecting the reference plane, the method comprising:

deciding a plurality of target values regarding a relative distance in the first direction between the reference plane and a lens based on height information regarding the height, the plurality of target values being different from each other;

capturing a first image including a whole of the region from the first direction, with the relative distance in the first direction between the reference plane and the lens adjusted based on a first target value from among the plurality of target values;

capturing a second image including the whole of the region from the first direction, while fixing a relative position between the region and the lens in second and third directions to a capturing position of the first image, with the relative distance in the first direction between the reference plane and the lens adjusted based on a second target value among the plurality of target values, the second target value being different from the first target value, and the second and third directions intersecting each other along the reference plane;

extracting a first part including a first pattern from the first image including the first pattern and a second pattern, the first pattern and the second pattern being included in the plurality of patterns;

extracting a second part including the second pattern from the second image including the first pattern and the second pattern, the second pattern being different in height from the first pattern;

generating a synthetic image including the first part and the second part;

determining presence or absence of a defect in the template from the synthetic image;

deciding the first target value based on a first height information regarding the first pattern from among the height information in the deciding the plurality of target values; and deciding the second target value based on a second height information regarding the second pattern from among the height information in the deciding the plurality of target values, the second height information showing a different height from a height shown by the first height information.

11. The method according to claim 10, further comprising:

capturing a third image including the whole of the region from the first direction, with the relative distance in the first direction between the reference plane and the lens adjusted based on a third target value from among the plurality of target values, wherein the synthetic image is generated by arranging the first part and the second part at corresponding positions of the third image including the first pattern and the second pattern.

12. The method according to claim 11, further comprising:

acquiring arrangement information regarding an arrangement of the plurality of patterns, wherein the first part and the second part are specified and extracted respectively from the first image and the second image based on the arrangement information upon extracting the first part and the second part.

13. The method according to claim 12, wherein the height information and the arrangement information are included in CAD data.

* * * * *